(12) United States Patent
Harrington

(10) Patent No.: US 11,317,535 B2
(45) Date of Patent: Apr. 26, 2022

(54) COMPUTER COOLING SYSTEM AND METHOD OF USE

(71) Applicant: Chilldyne, Inc., Carlsbad, CA (US)

(72) Inventor: Steve Harrington, Cardiff, CA (US)

(73) Assignee: Chilldyne, Inc., Carlsbad, CA (US)

( * ) Notice: Subject to any disclaimer, the term of this patent is extended or adjusted under 35 U.S.C. 154(b) by 873 days.

(21) Appl. No.: 15/782,034

(22) Filed: Oct. 12, 2017

(65) Prior Publication Data

US 2018/0035569 A1 Feb. 1, 2018

Related U.S. Application Data

(63) Continuation of application No. 14/685,524, filed on Apr. 13, 2015, now abandoned, which is a
(Continued)

(51) Int. Cl.
*H05K 7/20* (2006.01)
*F28D 1/02* (2006.01)
(Continued)

(52) U.S. Cl.
CPC .......... *H05K 7/20272* (2013.01); *B23P 15/26* (2013.01); *F28D 1/0246* (2013.01);
(Continued)

(58) Field of Classification Search
CPC .......... B23P 15/26; F28D 1/0246; F28D 3/00; F28D 15/0233; F28F 1/28; F28F 7/02; H01L 23/473; H01L 2924/0002; H05K 7/20272; H05K 7/20281; H05K 7/20763; H05K 7/20772; Y10T 29/4935
See application file for complete search history.

(56) References Cited

U.S. PATENT DOCUMENTS 4,443,389 A * 4/1984 Dodds ...................... F28B 1/06
138/38
5,186,242 A * 2/1993 Adachi ................ B60H 1/3202
165/110
(Continued)

FOREIGN PATENT DOCUMENTS

CA 1185654 A * 4/1985 ......... H05K 7/20272

*Primary Examiner* — Henry T Crenshaw
(74) *Attorney, Agent, or Firm* — Manuel de la Cerra

(57) ABSTRACT

A reliable, leak-tolerant liquid cooling system with a backup air-cooling system for computers is provided. The system may use a vacuum pump and a liquid pump and/or an air compressor in combination to provide negative fluid pressure so that liquid does not leak out of the system near electrical components. Alternatively, the system can use a single vacuum pump and a valve assembly to circulate coolant. The system distributes flow and pressure with a series of pressure regulating valves so that an array of computers can be serviced by a single cooling system. A connector system is provided to automatically evacuate the liquid from the heat exchangers before they are disconnected. Leak detection and mitigation structures are also disclosed. Various turbulators are also provided, as well as a system and method for optimizing the heat transfer characteristics of a heat exchanger to minimize total energy requirements.

21 Claims, 29 Drawing Sheets

Related U.S. Application Data continuation of application No. 13/410,558, filed on Mar. 2, 2012, now Pat. No. 9,010,141.

(60) Provisional application No. 61/595,989, filed on Feb. 7, 2012.

(51) Int. Cl.
| | |
|---|---|
| *F28D 3/00* | (2006.01) |
| *F28D 15/02* | (2006.01) |
| *F28F 1/28* | (2006.01) |
| *F28F 7/02* | (2006.01) |
| *H01L 23/473* | (2006.01) |
| *B23P 15/26* | (2006.01) |

(52) U.S. Cl.
CPC ........... *F28D 3/00* (2013.01); *F28D 15/0233* (2013.01); *F28F 1/28* (2013.01); *F28F 7/02* (2013.01); *H01L 23/473* (2013.01); *H05K 7/20281* (2013.01); *H05K 7/20763* (2013.01); *H05K 7/20772* (2013.01); *H01L 2924/0002* (2013.01); *Y10T 29/4935* (2015.01)

(56) References Cited

U.S. PATENT DOCUMENTS

| | | | |
|---|---|---|---|
| 2008/0055846 A1* | 3/2008 | Clidaras | H05K 7/2079 361/679.41 |
| 2011/0060470 A1* | 3/2011 | Campbell | H05K 7/20836 700/282 |

* cited by examiner

Sec. A-A

Sec. A-A

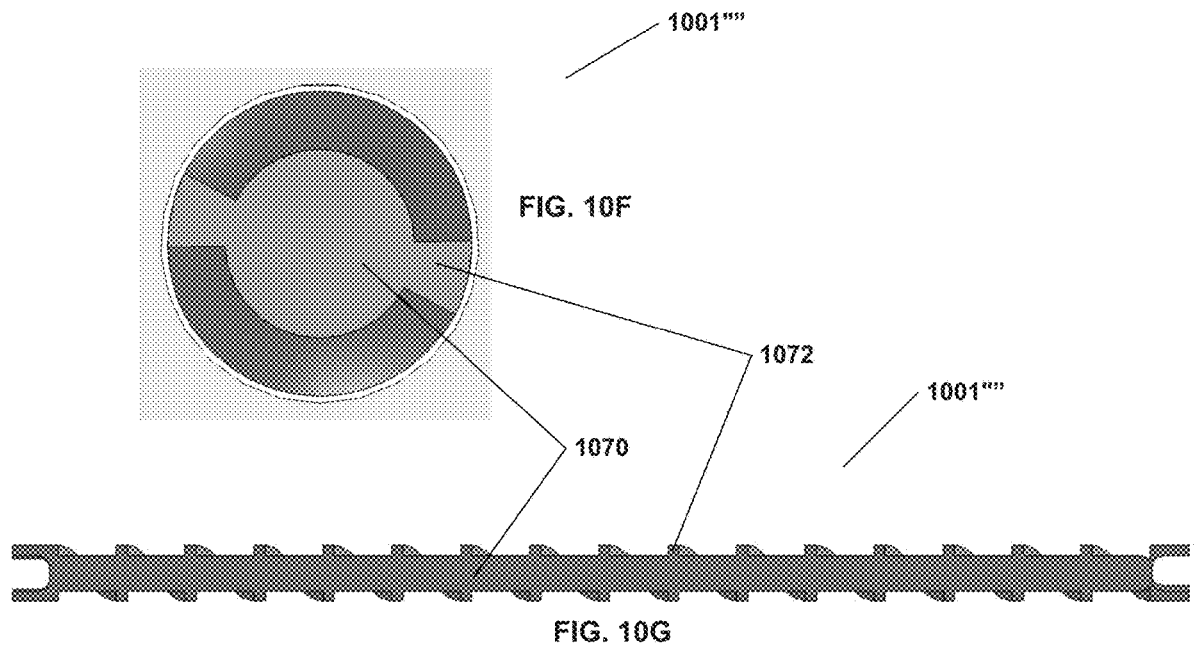
FIG. 10F
FIG. 10G
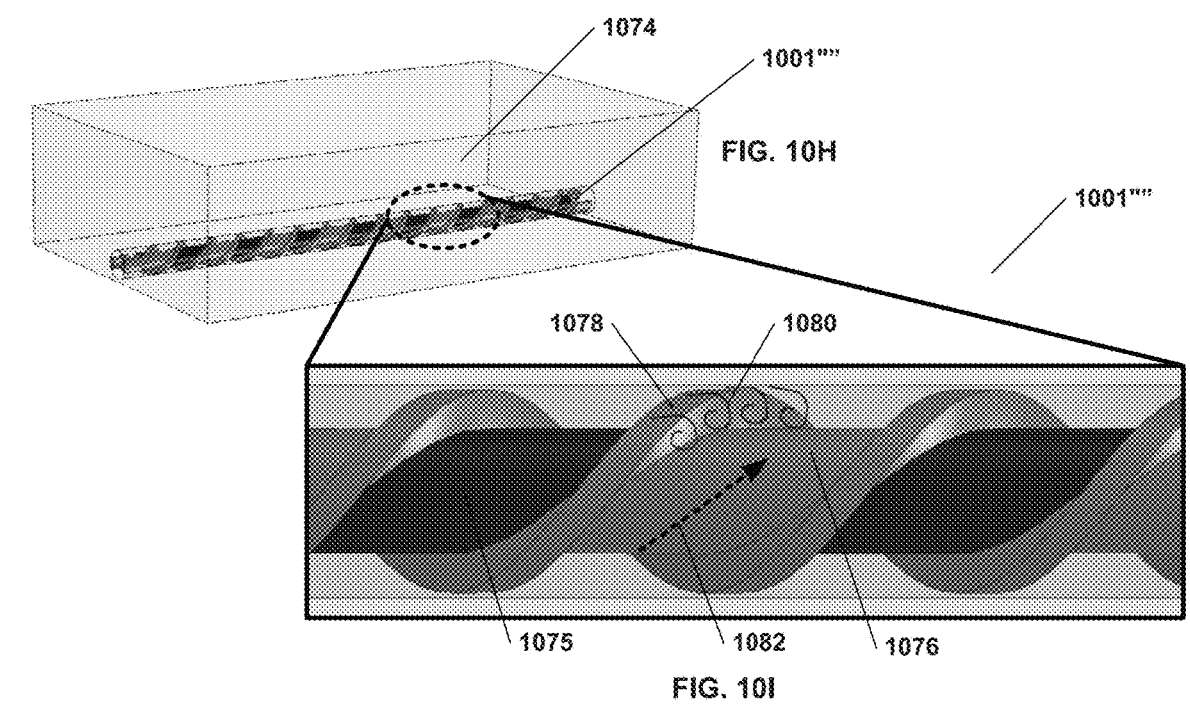
FIG. 10H
FIG. 10I

COMPUTER COOLING SYSTEM AND METHOD OF USE

1.0 CLAIM OF PRIORITY

The present application claims priority as a continuation of U.S. patent application Ser. No. 14/685,524 filed on Apr. 13, 2015, which is a continuation of U.S. patent application Ser. No. 13/410,558 filed on Mar. 2, 2012, now U.S. Pat. No. 9,010,141 issued on Apr. 21, 2015, which is a non-provisional of U.S. Patent Application Ser. No. 61/595,989 filed on Feb. 7, 2012. The full disclosure of each of these references is herein incorporated by reference.

The present application is also related to U.S. Patent Application Ser. No. 61/451,214 filed on Mar. 10, 2011, U.S. patent application Ser. No. 13/308,208 filed on Nov. 30, 2011, U.S. Patent Application Ser. No. 61/422,564 filed on Dec. 13, 2010, and U.S. patent application Ser. No. 12/762,898 filed on Apr. 19, 2010. The full disclosure of each of these references is herein incorporated by reference.

2.0 TECHNICAL FIELD

The present invention relates to systems and methods for cooling computer systems.

3.0 BACKGROUND

Arrays of electronic computers, such as are found in data centers, generate a great deal of heat. An example Central Processing Unit of a computer ("CPU") generates over 100 watts of heat and has a maximum case temperature of about 60 C. An example rack of 88 CPUs may generate 9 kW of heat. The outdoor temperature at a hot urban location might be 45 C, so even in hot environments heat can still theoretically flow away from the higher temperature computer and toward the lower temperature outside environment. Accordingly, no refrigeration of computers should be required, theoretically. Nonetheless, the standard way to keep data centers cool is to use expensive and relatively inefficient vapor-compression refrigeration systems at least part of the time. These conventional cooling or "air conditioning" systems often use more power that the computers themselves, all of which is discharged to the environment as waste heat. These systems use air as the heat transfer medium, and it is due to the low heat capacity and low thermal conductivity of air that refrigeration must be used to remove the heat generated by multiple air heat exchangers. Removing heat generated by heat exchangers is also referred to as overcoming the thermal resistance of the heat exchangers. Some operators use evaporation of cooling liquid to cool cooling liquid-to-air heat exchangers that cool computers, and this is more thermally efficient than refrigeration, but the computers run hotter, reducing their reliability, decreasing their efficiency and making the data center uncomfortable for human occupants. Water is used as the cooling liquid or coolant throughout this disclosure, but it will be known to those in art that other coolants may be used. The cooling liquid may consist essentially of water, including tap water, or may comprise one or more perfluorocarbons or avionics cooling liquids. The cooling liquid may flow over a plated surface.

Water has approximately 4000 times more heat capacity than air of the same volume, so water is a theoretically ideal heat transfer agent for direct heat transfer from heat generating components. Other cooling liquids offer similar performance. Liquid cooling is recognized as a thermally efficient way to cool computer CPUs due to their high concentration of power and heat generation in a small space, but the rest of a computer's electronics generate heat at a lower rate and temperature, so air-cooling is appropriate for much of the associated hardware. Current systems may use liquid cooling to move the heat from the CPU to a radiator mounted close to the CPU, or they may use an air-to-liquid heat exchanger to remove heat from the computer enclosure and heat-up liquid in the heat exchangers. These systems suffer from the high thermal resistance and bulkiness of air-to-liquid or liquid-to-air heat exchangers. Other systems use a chilled cooling liquid loop to cool the computer, but these systems require complex and expensive connectors and plumbing to connect the server to the building cooling liquid supply while ensuring that no leaks occur, which may be devastating in or near a computer. Accordingly, operators of server systems are rightly concerned about leaks and reliability of cooling liquid-cooled computers. Furthermore, chillers require a large amount of power. Additionally, for operation in a data center, servers, particularly blade servers, need to be compact. Therefore, what is needed is a compact cooling solution adaptable for up to a large number of computers, one that combines and balances air-cooling capacity for low-intensity heat sources with cooling liquid-cooling capacity for high-intensity heat sources while using a minimum amount of cooling liquid flow, and one that is reliable, leak-free and low in power consumption.

4.0 SUMMARY

The present system addresses these issues and more by providing in various example embodiments an efficient and compact heat exchanger for a CPU utilizing liquid under negative pressure to minimize chances of leakage, with an air-cooling backup system. Also provided is a cooling solution that integrates with an air-cooled heat sink for backup and utilizes only the minimum amount of water necessary to provide adequate cooling for each heat-generating element. Various embodiments further provide systems and methods to cool the CPU, the server and the data center with liquid in an optimal manner, by cooling the CPU to reduce leakage current, removing heat from the data center by means of the air cooled portion of the CPU heat exchanger, and utilizing an outdoor evaporative cooling system or a dry cooler with a part-time evaporative cooling system that eliminates the need for a chiller in the liquid cooling system. Additionally, provided is a system and method for disconnecting and reconnecting liquid-cooled heat exchangers without losing any water. Heat exchangers employing efficiency-increasing turbulators are also provided.

Provided in various embodiments is a system for cooling one or more electrical devices inside a building, comprising: one or more liquid coolant-containing heat exchangers thermally coupled to one or more electrical devices and each having a liquid input port and a liquid output port and containing liquid coolant at below atmospheric pressure; a liquid coolant-containing chamber in fluid communication with the liquid output port of the heat exchanger(s), the chamber containing liquid coolant and gas at a pressure at least as low as the pressure of the liquid coolant in the heat exchanger(s); a vacuum pump in vacuum communication with the gas in the chamber; a fluid pump with a fluid intake port in fluid communication with the liquid coolant in the chamber, and a fluid output port in fluid communication with liquid coolant in an evaporative cooler operating at substantially atmospheric pressure and located at least partially outside the building; the evaporative cooler being in fluid communication with the liquid input port of the heat exchanger(s); wherein the fluid pump in combination with the vacuum pump causes the liquid coolant to flow from the chamber through the evaporative cooler and the heat exchanger(s) and back to the chamber. Alternatively, the optional evaporative cooler or other external cooling means can be in a separate loop, not in fluid communication with the electronics-mounted heat exchanger system, which may transfer heat to the external cooling loop via an additional water-to-water (liquid-to-liquid) or other heat exchanger.

Also provided in various embodiments is a system for cooling at least one electrical device inside a building, comprising: one or more liquid coolant-containing heat exchangers thermally coupled to a first electrical device and having a liquid input port and a liquid output port and containing liquid coolant at below atmospheric pressure; a system of first and second chambers comprising: a first liquid coolant-containing chamber in one-way fluid communication with the liquid output port of the heat exchanger, the first chamber containing liquid coolant and gas; a second liquid coolant-containing chamber in one-way fluid communication with the liquid output port of the heat exchanger, the second chamber containing liquid coolant and gas; a vacuum pump switchable in vacuum communication with the gas in the first and second chambers; a source of higher pressure air in switchable pressure communication with the gas in the first and second chambers; the liquid coolant in the first and second chambers in one-way fluid communication with liquid coolant in an evaporative cooler operating at substantially atmospheric pressure and located at least partially outside the building; the evaporative cooler in fluid communication with the liquid input port of the heat exchanger; wherein the vacuum pump and the higher pressure air source coordinates with the system to serially pressurize and depressurize the first and second chambers and thereby cause the liquid coolant to flow substantially steadily from heat exchanger through the system of first and second chambers to the evaporative cooler and back to the heat exchanger. Once again, the optional evaporative cooler or other external cooling means can be in a separate loop not in fluid communication with the electronics-mounted heat exchanger system, which may transfer heat to the external cooling loop via an additional water-to-water or other heat exchanger.

In any of the systems the liquid coolant-containing heat exchangers may comprise one or more turbulators, and may also be thermally coupled to the atmosphere adjacent to the electrical device, where a fan may urge circulation of the atmosphere adjacent the liquid coolant-containing heat exchangers. A vacuum accumulator may be in fluid communication with and between the evaporative cooler and the heat exchangers. The turbulator may be located in a heat exchanger tube and configured to force the liquid coolant to flow in a path having a length more than twice the largest dimension of the heat exchanger tube, or may be configured to reduce the cross-sectional area of the flow path of the liquid coolant to less than 50% of the cross-sectional area of the heat exchanger tube. The turbulator may define a conical helix flow path for the liquid coolant, may direct a jet of liquid coolant against a surface proximate to one of the electrical devices, may define a rectangular cross-section helical liquid coolant flow path, a round cross-section helical liquid coolant flow path, a rectangular cross-section single-entry helical liquid coolant flow path, a rectangular cross-section double-entry helical liquid coolant flow path, a round cross-section single-entry helical liquid coolant flow path, a round cross-section single-entry helical liquid coolant flow path, or a round cross-section double-entry helical liquid coolant flow path. It may also define a helical path in which the direction of the helix reverses periodically, for example from left-handed to right-handed. For purposes of this aspect of the disclosure a square cross-section is considered a special case of a rectangular cross-section, i.e., one where the sides are the same length. Systems are provided wherein a portion of the liquid coolant flows axially over the outer surface of the turbulator, thereby causing swirl and turbulence in the flow path and increasing the heat transfer effectiveness of the turbulator.

Also provided are systems comprising: a connector releasably connecting the liquid coolant-containing heat exchanger to the chamber, the connector adapted to release the liquid coolant-containing heat exchanger from the chamber only when substantially all of the liquid coolant has been evacuated out of the heat exchanger. For example, provided are: a supply valve in removable fluid communication with the liquid input port of the heat exchanger; a return valve in removable fluid communication with the liquid output port of the heat exchanger; wherein the supply valve is actuatable to open the liquid input port of the heat exchanger to atmospheric pressure air that is at a higher pressure than the water inside the heat exchanger and thereby to evacuate the water from inside the heat exchanger; the supply valve and return valve are constructed to close and disconnect the heat exchanger from the system after the water is evacuated from inside the heat exchanger. A passive latching system is also provided. The latching system may include a mechanical delay in order to prevent premature disconnection.

Provided in various systems is a liquid level sensor located in the chamber and providing an output based on the level of the liquid in the chamber, the fluid pump being adapted to operate in response to the output of the fluid level sensor. In other embodiments, provided are fluid level sensors located in both the first and second chambers and providing first and second outputs, respectively, based on the respective levels of the liquid in the chambers, the vacuum pump and the pressure pump each being adapted to operate in response to one or both of the first and second outputs and to maintain the fluid levels in the chambers within predetermined ranges.

Systems may further comprise a vacuum regulator in vacuum communication with the vacuum pump and adapted to maintain a pressure in at least a portion of the system less than atmospheric pressure. Also provided may be a filter in fluid communication with the liquid coolant-containing heat exchanger and adapted to prevent debris from entering the liquid coolant-containing heat exchanger or valves. Additionally provided is a pressure regulator in fluid communication with the liquid coolant-containing heat exchanger, the pressure regulator adapted to provide a constant pressure differential across the liquid coolant-containing heat exchanger. A dome-loaded, spring-biased regulator, as is known in the art may accomplish this.

A method is provided of modifying a non liquid-cooled electrical device heat exchanger with fins extending from a base to become liquid-cooled, comprising the steps of: removing at least a portion of one or more of the fins and thereby making accessible a portion of the base; and affixing liquid cooling tubing having an input port and an output port to at least a portion of the exposed base.

A method is also provided of disconnecting a heat exchanger from a system for cooling at least one electrical device, as described herein, where the method comprises: providing such a system, and actuating the supply valve and opening the liquid input port of the heat exchanger to atmospheric pressure air that is at a higher pressure than the cooling liquid inside the heat exchanger; evacuating the cooling liquid from inside the heat exchanger; closing the supply valve and the return valve; and disconnecting the heat exchanger from the system after the cooling liquid is evacuated from inside the heat exchanger. This method may also apply to systems with a plurality of heat exchangers.

Further provided is a method of minimizing the energy needed to cool heat-generating electronics inside a cabinet having a higher than ambient temperature, comprising the steps of: providing a heat exchanger comprising: a thermally conductive base adapted to thermally couple to the heat-generating electronics; a plurality of thermally conductive fins extending outward from the base; and one or more cooling liquid pathways thermally coupled to the base and the fins; balancing the thermal load of the heat generating electronics and the ambient air inside the cabinet by positioning the one or more cooling liquid pathways relative to the base and the fins; thermally coupling the heat exchanger to the heat generating electronics; and providing a source of cooling liquid to the one or more cooling liquid pathways. This method may also comprise the steps of: providing a fan and locating the fan so that it causes air to flow across one or more of the fins; and balancing the thermal load of the heat generating electronics and the ambient air inside the cabinet by: positioning the one or more cooling liquid pathways relative to the base and the fins in further view of the heat transfer effect of the fan; and adjusting the speed of the fan.

Also provided is a system that uses one vacuum pump to circulate coolant under negative pressure. The system includes a pump connected to a vacuum line such that the pump creates a pressure of less than atmospheric on the vacuum line. The vacuum line, along with a pressurized line, is connected to a valve assembly, and that assembly is connected to a first and second fluid chamber. A coolant circuit is provided that allows coolant to circulate through the first and second chambers, through a primary heat exchanger and through an electrical device heat exchanger. The circulation is accomplished through a controller that operates the valve assembly. The circuit may also have a reservoir, various pressure and temperature sensors, and other valves and nozzles to optimize the system. The controller operates the valve assembly by substantially alternating between (a) actuating the valve assembly to create a higher pressure in the first coolant chamber relative to the second coolant chamber, thus emptying coolant from the first coolant chamber and drawing coolant into the second coolant chamber; and (b) actuating the valve assembly to create a higher pressure in the second coolant chamber relative to the first coolant chamber, thus emptying coolant from the second coolant chamber and drawing coolant into the first coolant chamber. The system may also optionally have a coolant recovery device so as to minimize the maintenance of the system.

Other aspects of the invention are disclosed herein as discussed in the following Drawings and Detailed Description.

5.0 BRIEF DESCRIPTION OF THE DRAWINGS

The invention can be better understood with reference to the following figures. The components within the figures are not necessarily to scale, emphasis instead being placed on clearly illustrating example aspects of the invention. In the figures, like reference numerals designate corresponding parts throughout the different views and/or embodiments. It will be understood that certain components and details may not appear in the figures to assist in more clearly describing the invention.

FIG. 10F illustrates cross-sectional views of a turbulator.

FIG. 10G illustrates cross-sectional views of a turbulator

FIG. 10H illustrates a turbulator traveling through a heat exchanger.

FIG. 10I illustrates a turbulator traveling through a heat exchanger.

6.0 DETAILED DESCRIPTION OF EXAMPLE EMBODIMENTS

Following is a non-limiting written description of example embodiments illustrating various aspects of the invention. These examples are provided to enable a person of ordinary skill in the art to practice the full scope of the invention without having to engage in an undue amount of experimentation. As will be apparent to persons skilled in the art, further modifications and adaptations can be made without departing from the spirit and scope of the invention, which is limited only by the claims.

6.1 Example Negative Pressure System Designs

Figure 1:
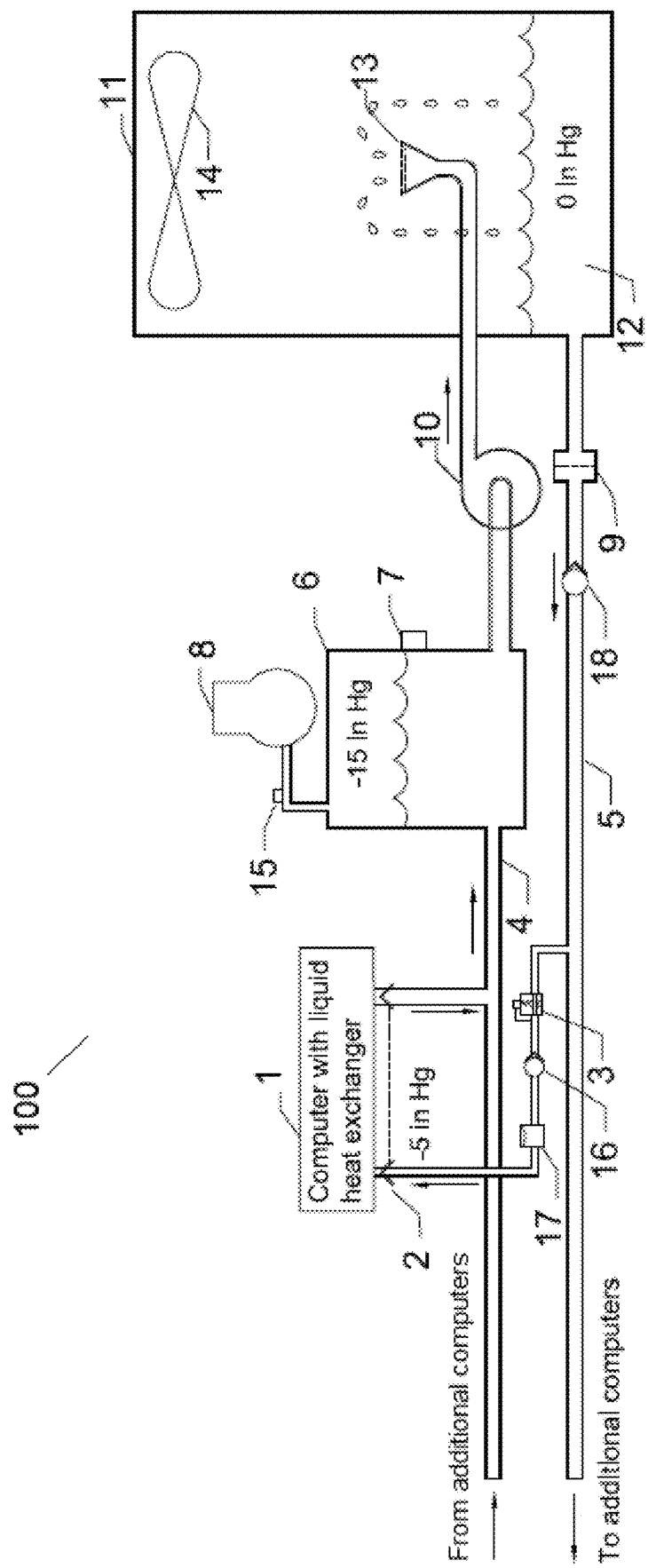
FIG. 1 is a diagram of a vacuum-pumped liquid cooling system according to various example embodiments.

Referring to the example liquid cooling system 100 shown in FIG. 1, the system 100 provides liquid cooling under negative pressure for an array of computers or other heat generating devices with liquid heat exchangers 1 with a minimal flow rate and a minimal volume of cooling liquid in order to provide cooling in an efficient and reliable manner. The system 100 may be the same as that disclosed in U.S. Pat. Pub. No. 2011/0253347 A1 to Harrington, published Oct. 20, 2011, the full disclosure of which is incorporated herein by reference. In certain embodiments, the system 100 includes a cooling tower 11, which may be outdoors, to cool the cooling liquid 12, a cooling liquid distribution system 4, 5 to supply cooling liquid to multiple CPUs, high performance heat exchangers 1 to remove heat from said CPUs with a minimum flow rate and pressure drop, a vacuum pump 8 to suck cooling liquid 12 through said CPUs heat exchangers and to remove any excess air that may enter the system 100. Water can be used for the cooling liquid 12 due to its low viscosity and high heat capacity. Alternatively, perfluorocarbons, avionics cooling liquids or any other suitable fluids may be used. In addition the system 100 may include an air-cooled heat exchanger (see, e.g., air-cooled heat exchanger 21 in FIG. 2) attached to each CPU to remove the heat in the event that the liquid cooling system 100 is not operating. The fan that is typically connected with a CPU heat exchanger (not shown) may also be used to cool the interior of the computer by transferring heat from the air inside the computer to the cooling liquid so that other components within the server enclosure may be cooled with or without the use of external air flow. An air-to-liquid heat exchanger may also be used to remove any excess heat from the portions of the server not cooled by the liquid cooled heat exchanger.

Figure 8:
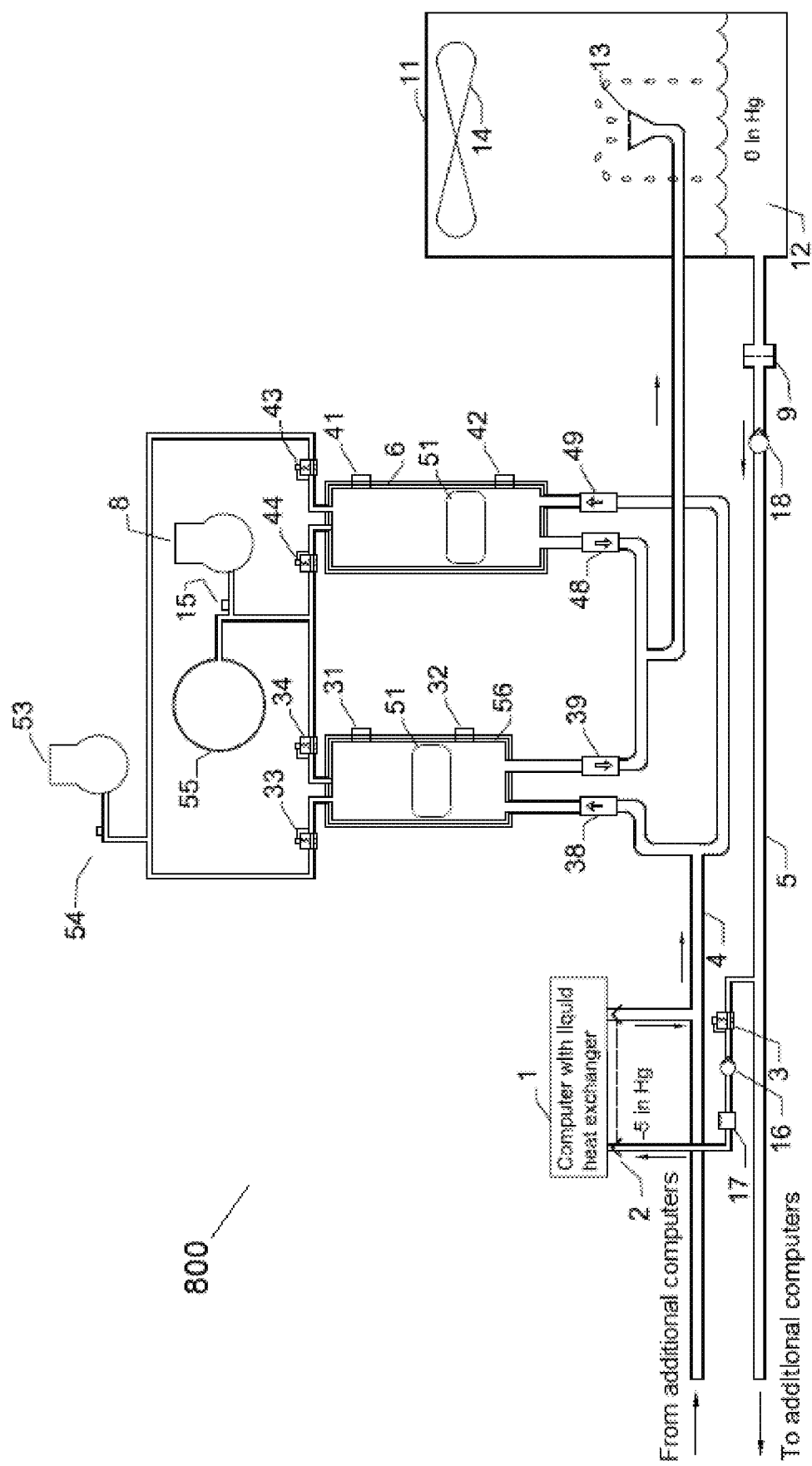
FIG. 8 is a diagram of a vacuum-pumped liquid cooling system according to various example embodiments.

In the example embodiment shown in FIG. 1, a supply of cooling liquid 12 is maintained at a low temperature by the evaporation of the cooling liquid as it flows out of nozzle 13. The humid air flows out due to fan 14 in cooling tower 11. Due to the low pressure in the chamber 6, the cooling liquid flows through a filter 9, and through a check valve 18 and a supply pipe 5, through a pressure regulator 3, through another check valve 16 with a cracking pressure of approximately 1 in Hg, through a vacuum accumulator 17 and then through a fluid connector 2, to the computer, server, or server rack with internal heat exchanger 1. The cooling liquid 12 then receives heat from the internal electronic components in the computer, such as the CPU, and flows out through the connector to an extraction pipe 4 and then to the chamber 6. A vacuum is maintained within the chamber 6 by the vacuum pump 8. The vacuum pump 8 could be a piston type with a Teflon or similar seal, which has a long lifetime, or it could be a linear pump or a diaphragm pump or any other suitable pump. A liquid ring pump is particularly suitable for this application, in that it pumps moist air well. The vacuum pump 8 may be compatible with the humidity and any chemical used to prevent corrosion or biofilm growth. A float valve 51 may be used to keep cooling liquid 12 out of the inlet of the vacuum pump 8, as shown with respect to vacuum pump 53 in FIG. 8. The vacuum pump 8 may be controlled by a pressure sensor 15 to maintain an absolute pressure that is above the vapor pressure of the cooling liquid 12 in its heated state, to keep the cooling liquid 12 in its liquid phase. The chamber 6 may include a level sensor 7 and regulator such that if a certain level is exceeded, the liquid pump 10 speeds up, thereby pumping cooling liquid 12 out of the chamber 6 and into the cooling tower 11. This may provide a constant pressure differential to multiple heat sources 1. The cooling tower 11 will require makeup cooling liquid to replace cooling liquid that is evaporated, as is known in the art of evaporative coolers generally. The optional cooling tower 11 to cool down the cooling liquid 12 may use convection and evaporation in order to reduce the temperature of the cooling liquid 12 to the local wet bulb temperature or whatever temperature is required by the CPUs, which is typically less than 30 C.

The cooled cooling liquid 12 is preferably moved through the heat exchanger 1 under a pressure that is less than the local atmospheric pressure. In certain embodiments the entire system 100 runs at a low absolute pressure, so that any leaks are of air into the system 100, rather than cooling liquid 12 out of the system 100. One potential issue with cooling liquid-cooled negative pressure systems is that at low absolute pressures, cooling liquid may boil. For example, at 50° C., water boils at 4 in Hg absolute, so the pressure in water-based systems cannot get that low. Accordingly, this limits the potential pressure drop available to each heat exchanger 1 to the difference between the vapor pressure of the warmest cooling liquid 12 within the system 100 and the local absolute atmospheric pressures. Maximum pressure drops available for each heat exchanger 1 are thus substantially less than one atmosphere. The remainder of the available pressure drop must be used for plumbing to and from the heat exchangers 1 and the pump 10, including head loss, elevation changes, and increases in flow resistance due to fouling.

The plumbing 4, 5, etc. to and from the computer/server/CPU heat exchangers 1 may be designed for unusually low pressure drop, so as to keep the total pressure drop of the system 100 within the aforesaid limits. This may be accomplished in certain embodiments by using, for example, simple surgical tubing or similar light-duty material with large-radius bends and low-pressure-drop fittings, which would not work with conventional high-pressure systems. Conventional high-pressure systems typically use heavier-duty plumbing with sharp bends and large pressure-drop interfaces, which combine to create systems having too much overall pressure drop to work as described herein.

Alternatively, the plumbing 5, etc. to the computer/server/CPU heat exchangers may be high pressure plumbing supplied by an additional pump (not shown), with a pressure regulator 3 to reduce the pressure to below atmospheric as the cooling liquid 12 gets close to the electronics. For the return plumbing 4, etc., larger pipes may be required for the flow of air and cooling liquid, as air will be introduced to the system as computers/servers are removed or replaced. Local air removal systems (not shown) may be used in order to prevent the return plumbing 4, etc., from getting too large. Such systems may use local vacuum pumps, plumbing to a central vacuum pump, or float actuated drain valves and multiple compartments, as in U.S. Pat. No. 4,967,832 to Porter, published Nov. 6, 1990, the full disclosure of which is incorporated herein by reference.

Each server or computer with a liquid heat exchanger 1 may have an inlet pressure regulator 3 and an outlet pressure regulator (not shown) in order to maintain a desired pressure drop across the CPU heat exchanger 1. Each CPU may have a temperature sensor (not shown), and an increase in temperature over the inlet cooling liquid temperature may indicate a problem with the heat exchanger 1. A temperature sensor, such as a thermistor, may be used to measure the inlet cooling liquid temperature. Flow meters, such as a rotameter, thermal mass flow sensor or turbine meter with a digital readout (not shown), may also be used to monitor the flow. The filter 9 may be used after the cooling tower 11 and before the heat exchanger 1 to prevent clogging of the passages in the heat exchanger 1. Chemical additives may be used to prevent fouling of the heat exchanger 1 with biological films and to prevent corrosion. The internal passages of the heat exchanger 1 may be plated or anodized to prevent corrosion.

The cooling liquid chamber 6 is preferably at a lower pressure than that of the heat exchanger on the device being cooled. This can be accomplished by keeping the chamber 6 at a lower elevation than the heat exchanger 1 or by means of a check valve with a given cracking pressure or a pressure regulator (see, e.g., check valves 38 and 49 in FIG. 8). This will provide negative pressure at the CPU heat exchanger 1 by means of a gravity head. Example cooling liquid distribution systems 100 may provide the cooling liquid 12 at a pressure of approximately −2 in Hg to the computer/server/CPU heat exchangers 1. This may be accomplished by means of the design of the system 100, or by placing a pressure-regulating valve 3 at the server or rack level. The plumbing from the fluid supply chamber 6 to the computer/server/CPU heat exchangers 1 may require an additional pump (not shown) in the feed line 5 if the computer/server/CPU heat exchanger 1 is at a significantly higher elevation than the cooling tower 11, such as if it is on a higher floor than the cooling tower 11. Such a supply pump's speed may be controlled so that the pressure at the computer/server/CPU heat exchangers 1 is at the correct value.

For the liquid pump 10, a seal-less centrifugal pump with a magnetic drive may be used, as well as a solenoid pump with an internal fluidic check valve, such as described in U.S. Pat. No. 1,329,559 to Tesla, published on Feb. 3, 1920, the full disclosure of which is incorporated herein by reference. In addition, a system may be required to prime the pump 10, as is known in the art of pumps. For example, this may be accomplished by turning off the liquid pump 10 and allowing fluid 12 to flow back through the pump 10. A flow actuated shuttle valve in the pump output (not shown) may be at a default off position allowing the vacuum pump to suck fluid into the chamber 6. Once the liquid pump 10 is primed and the level sensor 7 is activated, the liquid pump 10 may then turn on and pump the fluid out of the chamber 6 and into the cooling tower 11. A pump 10 with a low net positive suction head (NPSH) is preferred, so that the cooling liquid does not cavitate at the inlet of the pump 10. The liquid pumps 10 and vacuum pumps 8 for the system 100 may be selected to be reliable and have a long life. They also may provide a steady pressure on the suction side, and a low pressure on the outlet, in order to deliver flow to the cooling tower 11. One example design for maximum operational life would be to use a dual chamber pump such as described in, for instance, U.S. Pat. No. 7,611,333 B1 to Harrington, published on Nov. 3, 2009, the full disclosure of which is incorporated herein by reference, due to the very low NPSH required and due to its ability to reject bubbles from the inlet flow. Such a pump, when driven by a vacuum pump and an air compressor, may provide a very low inlet pressure and an independent output pressure. This type of pump may be fitted with additional backup vacuum pumps and compressors (not shown) connected with check valves so that any single point failure would not cause a system-wide failure. In addition, the check valves and pressurization and vacuum valves and controls may include redundant units (not shown). A condenser and automatic drain system may be required to capture any coolant vapor and droplets, which may be pumped out by said vacuum pump.

Although a computer or server or server rack with a liquid heat exchanger 1 is described, systems such as system 100 maybe used to cool any electronic component. Although water is described in various embodiments, any coolant 12 may be used instead of or in addition to water. Although the system 100 is described as using cooling liquid 12 for evaporation and for cooling, a liquid-to-liquid heat exchanger may be used to transfer heat from an evaporator to a closed system (not shown) so that any coolant 12 may be used to interact with the hot components such as CPUs, such as a non-corrosive or non-conductive coolant. This may be used in the case of evaporative coolers 11 that use salt water or reclaimed water, for example. In this way, the coolant used for the computer heat exchangers 1 may be separate from the cooling used for other systems. Then the heat can be transferred from one system to another using, for instance, a plate type heat exchanger in a separate cooling loop. For low temperature operation, as in Northern latitudes, a radiator (not shown), fan 14 and glycol system may be used to reject the heat while preventing freezing of the coolant 12. A mister system can evaporatively pre-cool the air going into the radiators (dry coolers) for use during occasional hot days. Since CPUs can get up to 60 C, cooling liquid 12 can be heated to 50 C and still be used to cool the CPUs. The cooling liquid used for cooling the computers may be kept at a temperature higher than the dew point of the air in the data center to prevent condensation on the plumbing or the heat exchangers.

Figure 8A:
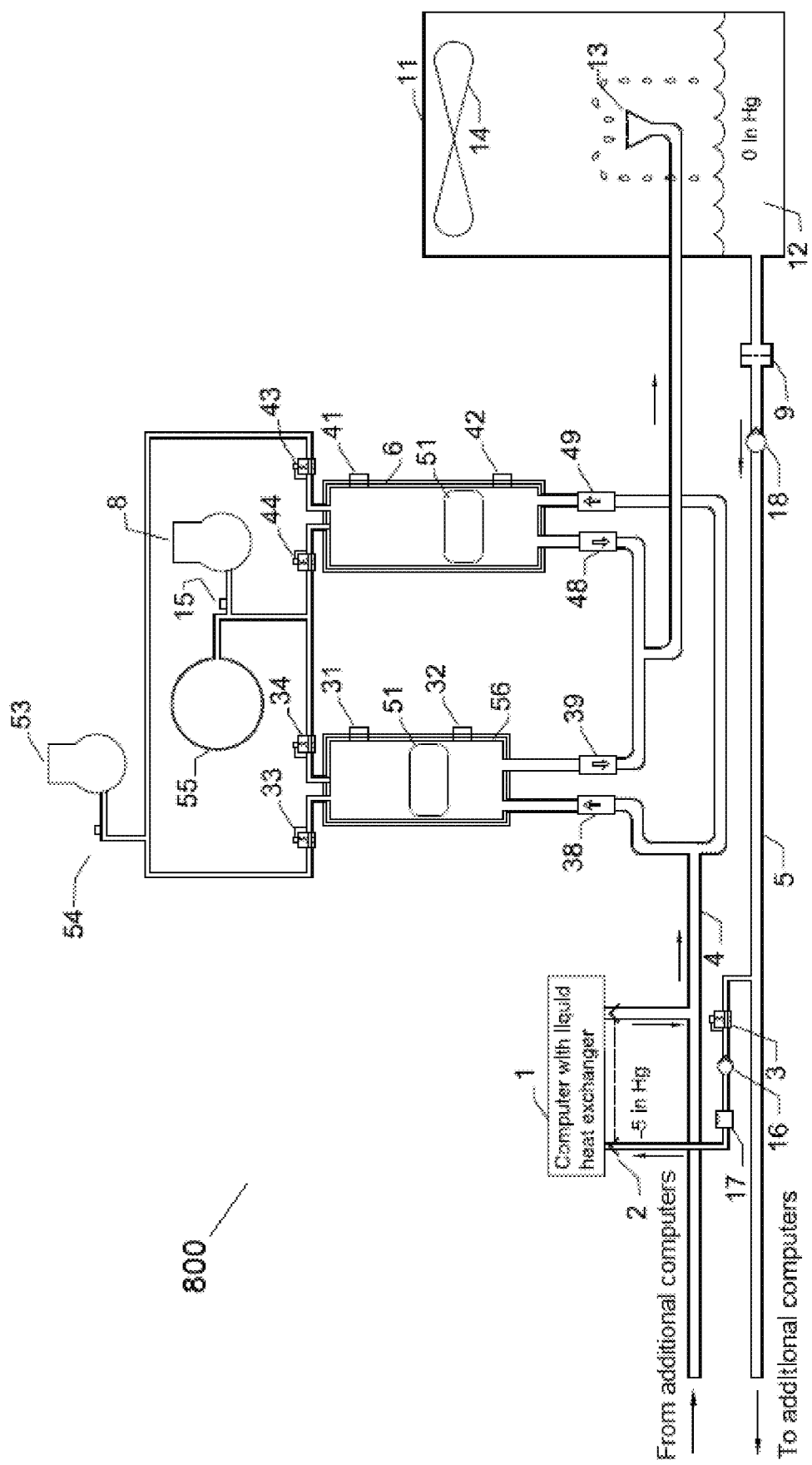
FIG. 8A is a diagram of a vacuum-pumped liquid cooling system according to various example embodiments.

Referring now to the example liquid cooling system 800 shown in FIG. 8A, the vacuum pump 8 (which may be a centrifugal pump) and chamber 6 of FIG. 1 has been replaced by a multiple chamber pump which acts as a vacuum pump, chamber, cooling liquid/air separator and pressure pump. In example liquid cooling system 800, the system may use a plurality of chambers, such as a main chamber 6 and an auxiliary chamber 56. The operation of example system 800 is as follows: the cooling liquid 12 flows under suction in to the chamber 6 from the extraction pipe 4 through check valve 49. The pressure in the chamber 6 is maintained at a low level by vacuum pump 8, which is connected to the chamber by valve 44. A vacuum chamber, 55 may be used to provide a steadier suction. A vacuum chamber 55 may likewise be located at each server rack 1, and it may have a float-actuated water release to allow for the release of any accumulation of water. Such local air release systems may require local vacuum pumps 8 or connection to a central vacuum system (not shown).

The cooling liquid flows into the chamber 6 until the level sensor 41 indicates that the chamber 6 is nearly full. Then the valve 34 opens, connecting the vacuum pump 8 with the auxiliary chamber 56 and lowering the pressure of auxiliary chamber 56 so that cooling liquid may flow into it from the extraction pipe 4 through check valve 38. Once the flow of cooling liquid is established into both chambers 6 and 56, valve 44 shuts and valve 43 opens, connecting chamber 6 with the pressure pump 53 and thereby pressurizing the main chamber 6 so that cooling liquid flows through check valve 48 and into the cooling tower 11. Then the level in chamber 6 reaches a low level, as indicated from level senor 42, at which time the valve 43 shuts. Then the valve 44 opens, and flow is again established under suction into the main chamber 6, at which time the auxiliary chamber vacuum valve 34 is shut and the valve 33 is opened connecting chamber 56 with the pressure pump 53 and forcing cooling liquid out of chamber 56 through check valve 39 until the level in the chamber 56 reaches the low-level sensor 32. Under normal operation, the level sensor 31 would not be activated because the system is designed so that the flow out of the chambers 6, 56 is higher than the flow into the chambers 6, 56, so that the auxiliary chamber 56 is never completely full, thereby allowing for the flow through the heat exchangers 1 to be steady while the flow to the cooling tower 11 is intermittent. Accordingly, the level sensor 31 can be used to indicate if there is a system failure. The pressure and vacuum levels can be monitored by the pressure pump 53 and the vacuum pump 8 using the pressure sensors 54 and 15. The entire system can be controlled by a computer or by a logic circuit or any other suitable means. Floats 51 may be used to sense the levels in the chambers 6, 56 and reduce evaporation of the cooling liquid 12 in the chambers 6, 56.

Figure 8B:
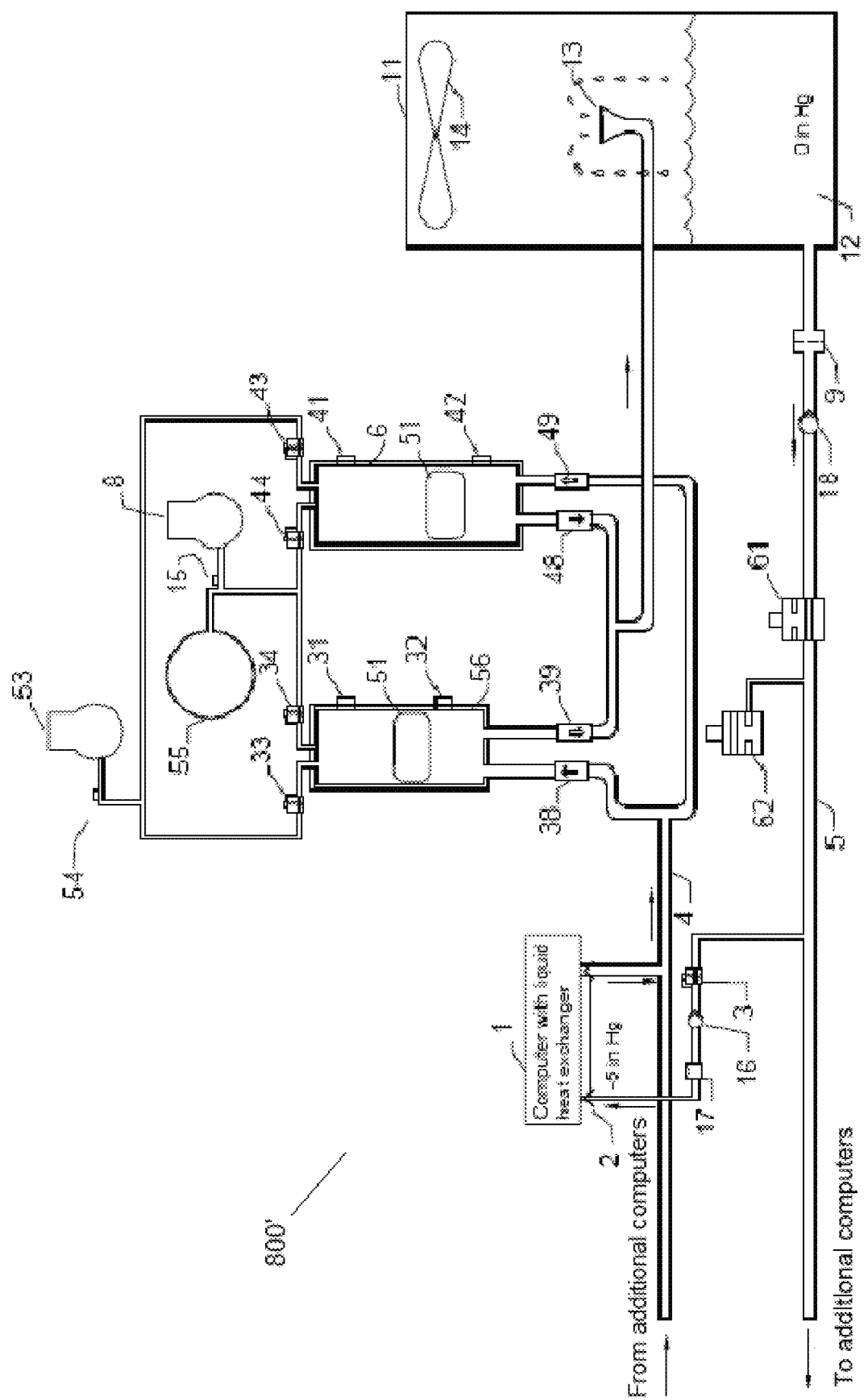
FIG. 8B is a diagram of a vacuum-pumped liquid cooling system according to various example embodiments.

Referring to FIG. 8B, the system 800' may be substantially the same as the system 800 in FIG. 8A, except the system 800' may further include a test valve 61 and a purge valve 62 and a pressure sensor (not shown). Test valve 61 and purge valve 62 and the pressure sensor may be used to test the system 800' for leaks and to purge air out of the system 800'. Temperature sensors (not shown) may also be added to the plumbing at locations 4 and 5 to provide data for determining the flow rate of heat removed by the system 800'. The duration of time that the vacuum pump 8 is on can be used to determine the rate of air flow in the system 800' and thereby the presence of an air leak can be inferred, for instance when the vacuum pump 8 runs longer or more often than normal. The pressure at the vacuum pump inlet may also be used to determine the amount of air flowing through the system, or an air flow sensor may be used. The operator can be alerted if excessive air is finding its way into the system. The entire pumping and monitoring system 800' can output data in real time to populate a web page or other output (not shown) that displays various parameters regarding the system in real time, such as, for example, heat pumped, air leak rate, coolant resistivity, pH or TDS, and the like. The pressure and level in the pump chambers can also be reported. The current to the air pump 53 and vacuum pump 8 can be measured and monitored to determine if either one is malfunctioning or wearing out. The plumbing 4, 5 from the pump system to the racks of computers/servers with liquid heat exchangers 1 can be connected with quick connect fittings such as, for instance, those available from the John Guest Corp., so that racks and servers 1 may be easily reconfigured.

Figure 18:
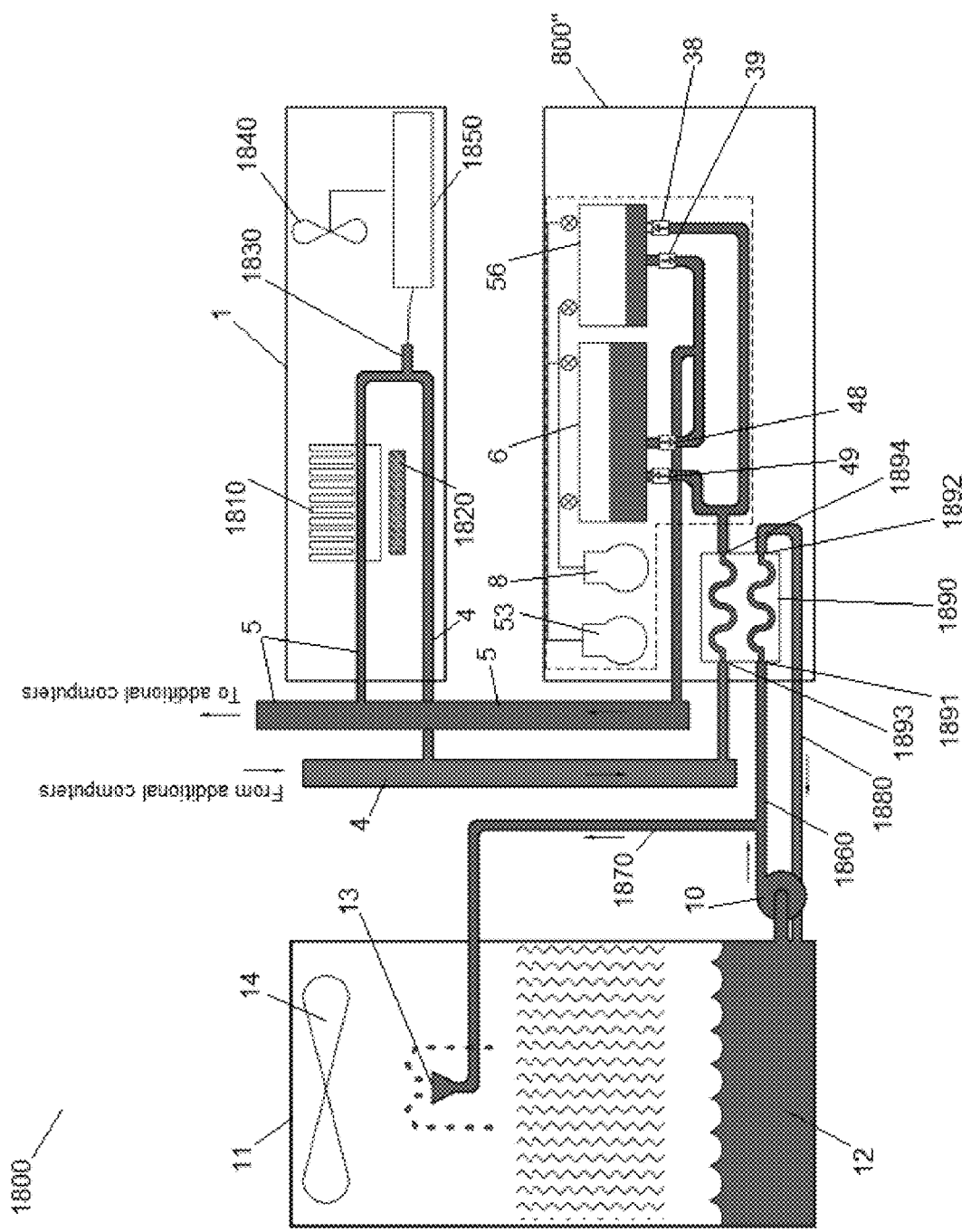
FIG. 18 is a diagram of a vacuum-pumped liquid cooling system according to various example embodiments.

Referring to FIG. 18, a system 1800 may be provided incorporating any or all of the features from systems 100, 800, or 800', except system 1800 demonstrates the option of using a closed and/or sealed liquid pumping system 800" to re-circulate liquid through liquid-cooled computers/servers/server racks 1 without exposing that liquid to the open atmosphere (and resulting contaminants) of an external cooling source such as a cooling tower 11. This may be accomplished by, for instance, providing a liquid-to-liquid heat exchanger 1890 that transfers heat from the liquid used in the liquid-cooled computers/servers/server racks 1 to a separate liquid 12 that is cooled externally, for instance by a cooling tower 11, as shown in FIG. 18. In the example embodiment shown in FIG. 18, cooled liquid 12 pumped from the cooling tower 11 enters the exchanger 1890 at a first cooled position 1891, and travels through the exchanger 1890 while picking up heat from the hot liquid leaving the computers 1 until that now-heated liquid 12 exits the exchanger 1890 at a second heated position 1892, after which it returns to the cooling tower 11 to be cooled. At the same time, separate heated liquid leaving the computers 1 enters the exchanger 1890 at a first heated position 1893, and travels through the exchanger 1890 while dissipating, losing, or otherwise transferring heat to the cool liquid from the cooling tower 11 until that now-cooled liquid exits the exchanger 1890 at a second cooled position 1894, after which it returns to the pumping system 800", having never mixed with the liquid 12 that flows through cooling tower 11. Systems such as system 1800 may advantageously use a clean, controlled liquid to circulate through the computers 1, while using a less expensive liquid such as gray water or sea water in the cooling tower, which needs to be supplemented regularly to make up for evaporation losses.

Also shown in system 1800 is a flow sensor 1830. The flow sensor 1830 may include a self-heated thermistor or RTD, such that if the liquid coolant stops flowing, or the coolant is too hot, the fan 1840 is turned on to high speed. This could be accomplished by flowing a known current through a thermistor such that in still coolant, and under 25 C ambient conditions, the thermistor temperature rises to 35 C. A comparator circuit could detect the voltage decrease associated with the temperature rise, and a MOSFET could be switched on to control the speed of the fan 1840. Under air cooling conditions, the power to fan 1840 would typically be on all the time, but under liquid-cooled conditions, the power to the fan 1840 could be pulse width modulated at 10-500 Hz to slow down the fan 1840 but not allow it to stop. The controller for the fan 1840 is represented by unit 1850. These features are applicable to any of the present systems.

Figure 9A:
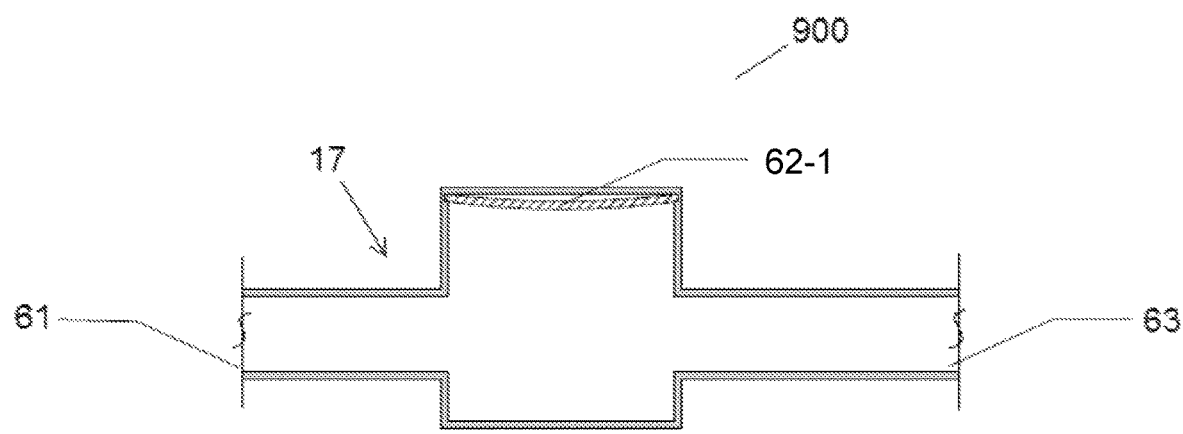
FIG. 9A is a sectional view of a vacuum accumulator used to prevent drops of cooling liquid from leaving the system when it is disconnected, shown in a low-vacuum condition.
Figure 9B:
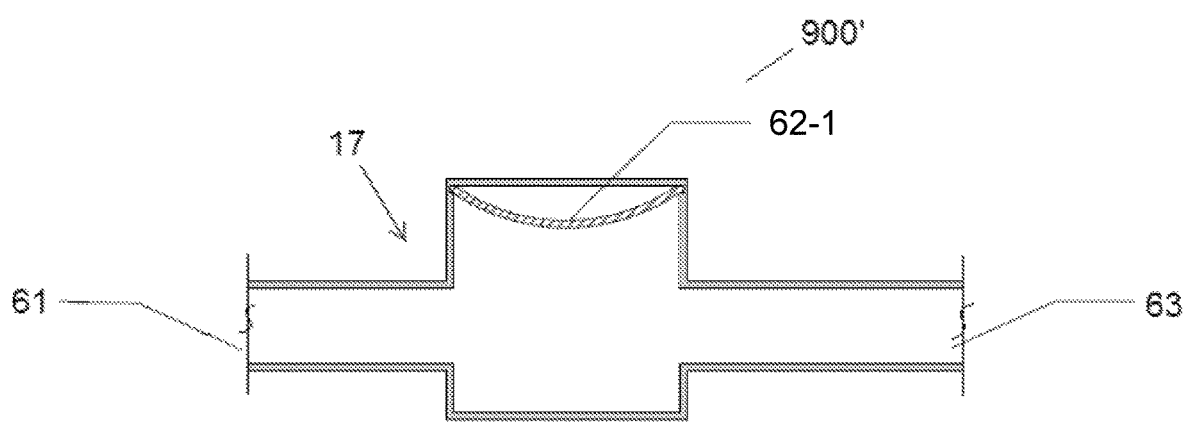
FIG. 9B is a sectional view of the vacuum accumulator of FIG. 9A, shown in a high-vacuum condition.

Referring to FIGS. 9A and 9B, an example vacuum accumulator 17 is shown in cross-section, having a liquid inlet 61 and liquid outlet 63. The vacuum accumulator 17 comprises a flexible diaphragm 62-1 which may be flat or nearly flat in state 900 when no pressure differential exists between inside and outside the accumulator 17, as in FIG. 9A. When a vacuum or pressure less than the external atmosphere is provided by the system inside accumulator 17, as in state 900', the flexible diaphragm 62-1 is displaced inwardly toward the liquid and holds a steady position as shown in FIG. 9B. If the CPU heat exchanger 1 is disconnected from the rest of the system 100, 800, 800', 1800, etc., then the check valve 16 shuts and the diaphragm 62-1 springs back into the flat position 900 as in FIG. 9A. This tends to suck cooling liquid towards the accumulator 17 and away from the fluid connector 2, prevent dripping of liquid out of the systems 100, 800, 800', 1800, etc.

Any leakage in the system may be detected by monitoring the cycle time of a pump 8 used to remove air from the systems 100, 800, 800', 1800, etc. If the pump 8 is cycling on too often, then a leak is indicated. The leak may be discovered by pulling a vacuum on each heat exchanger 1 and measuring the decrease in vacuum over time. A simple hand-operated vacuum pump may be used for this type of testing.

Systems 100, 800, 800', 1800, etc. may use a pump with a chamber (not shown) to supply fluid to all the heat exchangers 1. During a shutdown procedure, the pump may evacuate the system; purge it with air and store the fluid until such time as the liquid cooling system is reactivated. During a reactivation procedure, the pump control system may apply a vacuum or a pressure to the system; check to see if the fluid system loses vacuum or pressure and then start pumping again, based on the rate of change of the system pressure.

6.2 Example Dry-Disconnect Systems

Figure 5:
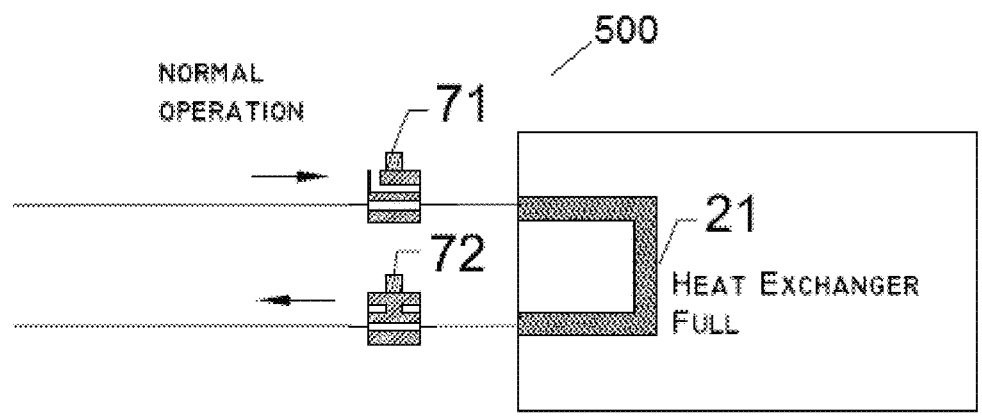
FIG. 5 is a diagram showing an example cooling liquid clearing disconnect system in normal operation.

FIG. 5 provides a diagram of an example coolant clearing system in normal operation 500, depicting the cooling liquid flowing through a supply valve 71 and then through a heat exchanger, 21, and then out through a return valve 72, all at less than atmospheric pressure. In this configuration the valves 71, 72 are both open to flow of cooling liquid and are sealed from the higher-pressure outside air.

Figure 6:
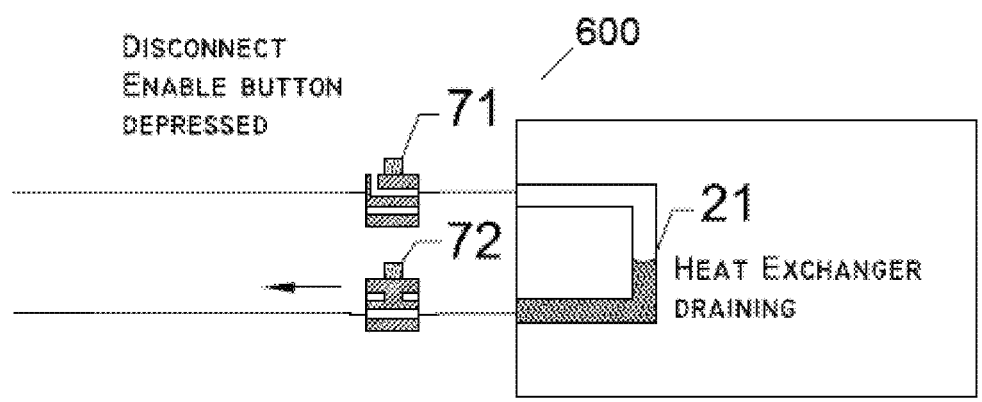
FIG. 6 is a diagram showing the example cooling liquid clearing disconnect system of FIG. 5 during the disconnect process.

FIG. 6 shows a diagram of the cooling liquid clearing system of FIG. 5 during the disconnect process 600. Before disconnecting the fluid supply and extraction lines (not shown), the valve 71 is opened to outside air, which allows higher-pressure outside air to flow into the valve 71 and into heat exchanger 21, shown schematically. The valve 71 may be connected to a latch (not shown) that prevents the fluid lines from being removed until the valve 71 is depressed or otherwise actuated to allow entry of air. The latch can be configured to remain in a latched position, so valve 71 remains actuated to allow entry of air until the connector (not shown) is reinserted into the computer.

Figure 7:
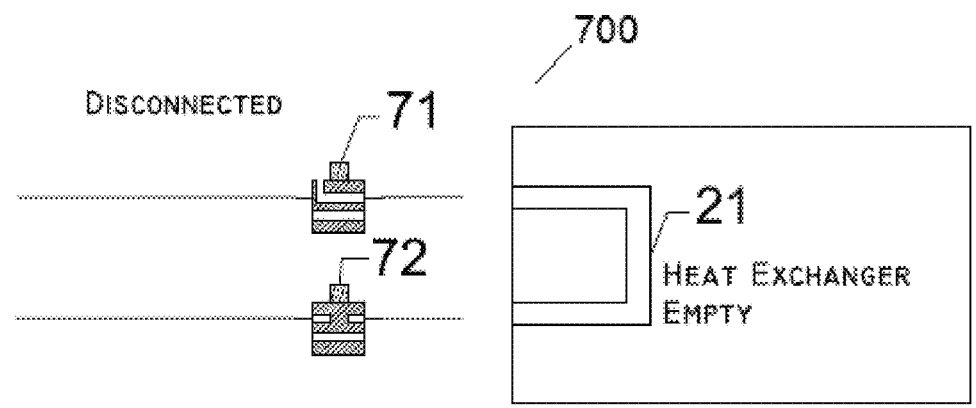
FIG. 7 is a diagram showing the example cooling liquid clearing disconnect system of FIG. 5 in a disconnected state.

FIG. 7 shows a diagram of the cooling liquid clearing system of FIG. 5 upon completion of the disconnect process 700, when the heat exchanger 21 is disconnected from the liquid cooling system 100. Upon completion of the disconnect process 700, the supply valve 71 is unactuated to seal the valve 71 from outside air so that air does not flow into the cooling system 100. A return valve 72 is likewise unactuated to seal the valve 72 from outside air so that air does not flow into the cooling system 100. Return valve 72 may be unactuated by a pin or latch (not shown) so that it shuts off when the heat exchanger 21 is disconnected from the liquid cooling system 100. The connector may be designed to prevent the disconnection of the heat exchanger 21 from the liquid cooling system 100 until all the liquid is removed from the heat exchanger 21. Such a disconnection prevention feature could be activated by the change in sub-atmospheric pressure present in the suction in the return line as the return line changes from being filled with cooling liquid to being filled with air. For example, the pressure drop across the heat exchanger 21 would be less, as the heat exchanger 21 changes from being filled with cooling liquid to being filled with air. This change in pressure drop could be calibrated to trigger the connector to allow disconnection of the heat exchanger 21 from the liquid cooling system 100 when the heat exchanger 21 changes from being filled with cooling liquid to being filled with air. This draining process may be helped by the following connector arrangement. To detach the connector in one embodiment, the operator depresses a button (not shown) that operates a three-way valve 71 that cuts off inlet cooling liquid flow and vents to allow air into the system 100. Negative pressure on the return side of the connector holds the connector in until air reaches the outlet. At this point, the negative pressure in the system is diminished due to the much lower delta pressure of air flowing through the heat exchanger and then the connector may be easily removed. Removal of the connector seals the outlet so that air does not continue to flow into the cooling system return flow path. The button stays depressed, thereby sealing off the inlet. To attach the connector, the operator would insert the coupling, which would connect the return path, and the button would automatically release, which would allow the supply flow to reach the components 1. This system may also be actuated with a twist instead of a button push, or by any other means of activation. Example connectors adaptable for use with the present system are described in U.S. Pat. No. 7,602,609 B2 to Spearing et al., published as application US 2008/0298019 A1 on Dec. 4, 2008, the full disclosure of which is incorporated herein by reference. The connector may utilize a sacrificial metal, such as zinc or utilize electrical potential to prevent corrosion inside the CPU heat exchanger 1. Using tap water that has a slight alkaline content for the cooling liquid 12 may reduce the corrosion rate for copper and brass heat exchangers 1.

Figure 16:
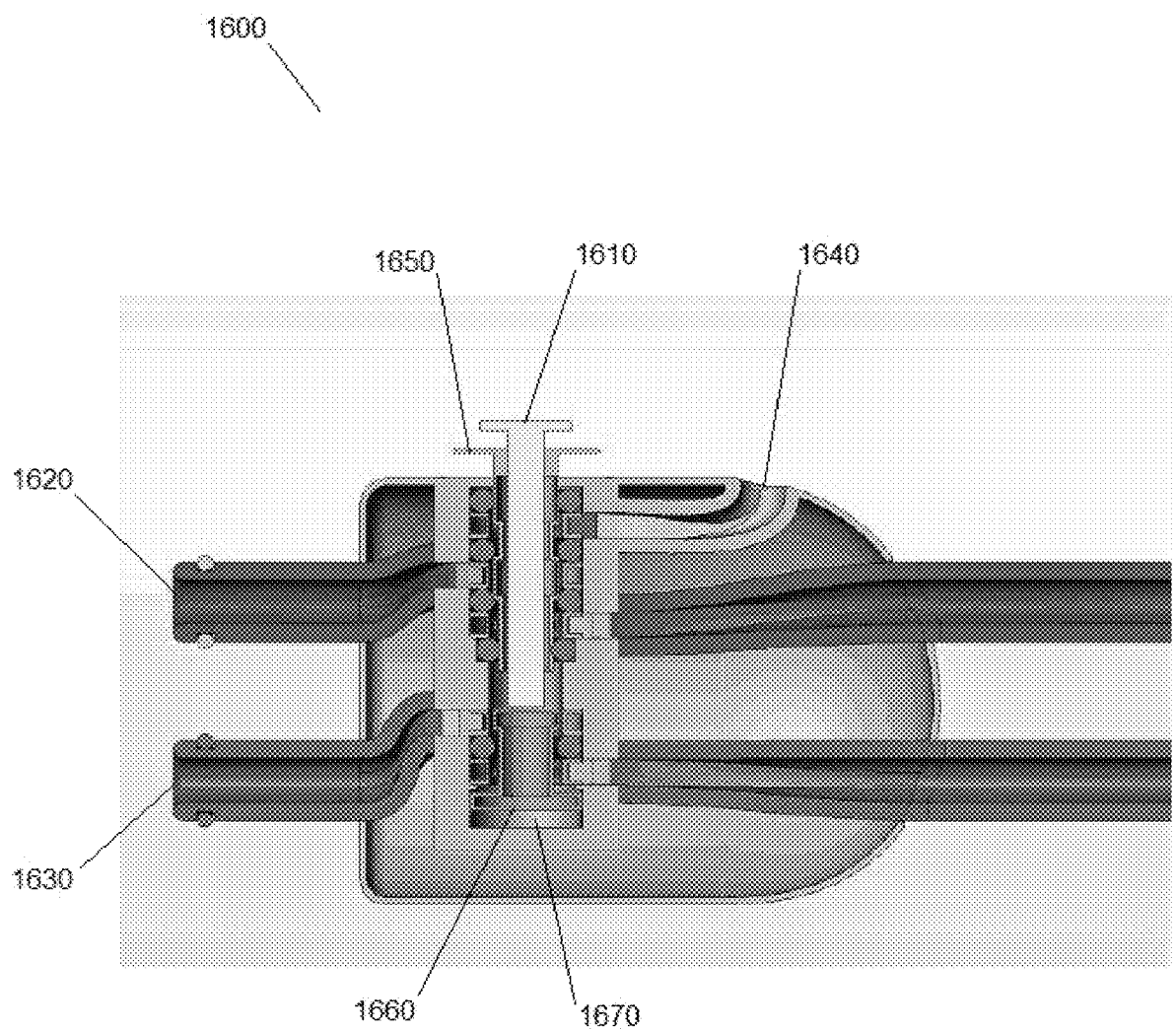
FIG. 16 is a sectional view of a side elevation of a valve according to various example embodiments.

For example, the computers/servers with liquid heat exchangers 1 may be connected to the pumping system using a connector 1600 such as that shown in FIG. 16, which prevents the user from disconnecting the server until the server is purged of cooling liquid. This connector 1600 may be used in conjunction with vacuum pumping systems 100, 800, 800, etc. The connector design 1600 in FIG. 16 achieves this in a two-step process. First, the user or another mechanism depresses the button 1610 which closes off the supply line 1620 to the server 1 and allows air to flow in through port 1640 into the system 100, 800, 800, etc. At that point the top spool valve 1650 will have moved downward (toward the bottom of the page in FIG. 16), but the bottom spool valve 1660 will not have moved yet, because its movement will be resisted by a hydraulic lock created by liquid still present in the bottom chamber 1670 below the spool valve 1660, which liquid will take a short period of time to be sucked out. The leak rate from bottom chamber 1670 is selected such that the second spool valve 1660 does not move until enough time has passed to ensure that the server 1 is purged of liquid 12. Thus, the spool valve is a mechanical device that creates a delay in releasing the connection, during which time the fluid can be evacuated avoiding a leak.

Then, once the fluid 12 is evacuated from the bottom chamber 1670 to a predetermined level, a larger leak opens up, the bottom spool valve 1660 drops all the way to the bottom of bottom chamber 1670, and the valve 1600 is closed or sealed from both the supply 1620 and return 1630 lines. The valve 1600 may be latched in the closed position until it is reconnected to a server 1, at which point both spools 1650, 1660 rise and the supply and return lines 1620, 1630 flow freely and the bottom chamber 1670 is refilled. The valve 160 may also be held in the intermediate position (i.e., with top spool valve 1650 closed while bottom spool valve 1660 remains open) by the negative pressure which will be present until the server 1 is purged of liquid 12. For example, a spring-loaded diaphragm or piston (not shown) could hold the valve in the intermediate position until the negative pressure was reduced, as it would be once the server 1 was completely vented of liquid. The valve 1600 may also be triggered by pressure differences created with an orifice or venturi, in which case differences would be higher when flowing liquid than when flowing gas, as is known in the art of fluid mechanics.

Figure 19C:
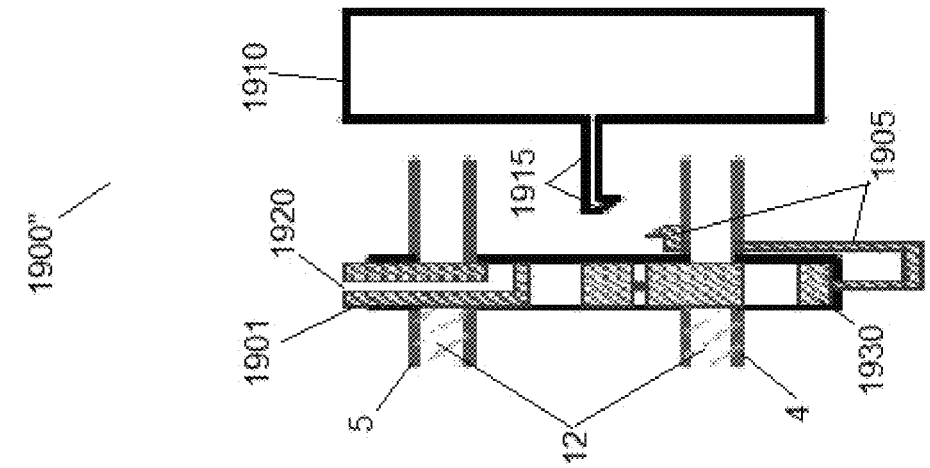
FIG. 19C is a sectional view of a side elevation of an example valve in the example cooling liquid clearing disconnect system of FIG. 19A in a disconnected state.
Figure 19B:
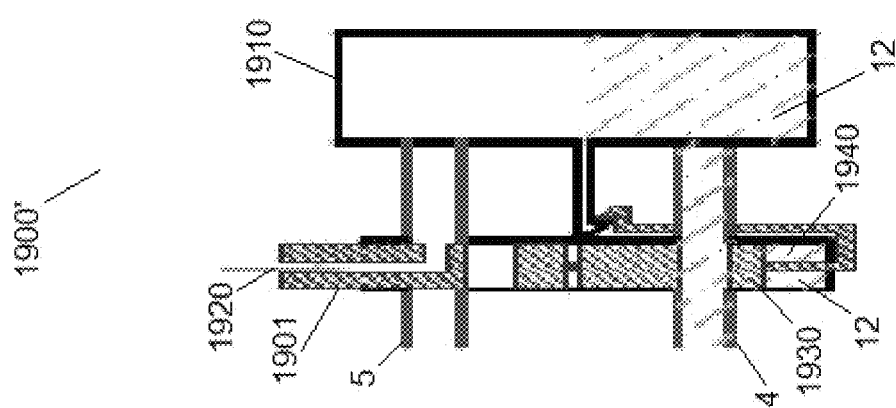
FIG. 19B is a sectional view of a side elevation of an example valve in the example cooling liquid clearing disconnect system of FIG. 19A during the disconnect process.
Figure 19A:
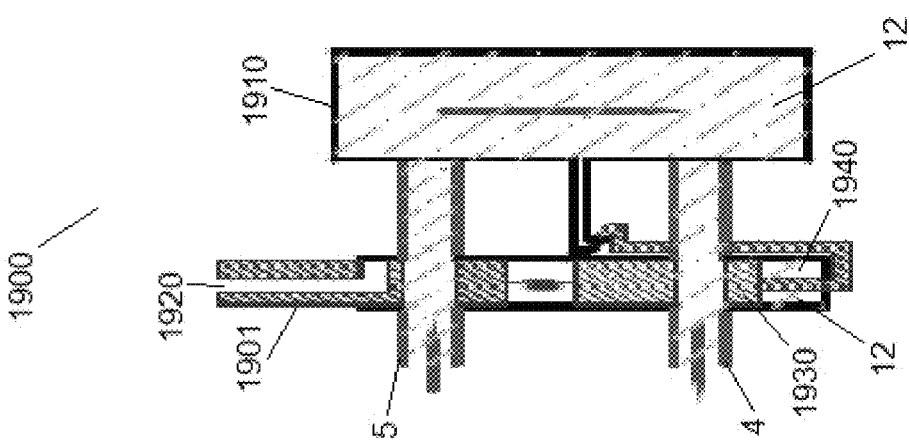
FIG. 19A is a sectional view of a side elevation of an example valve in an example cooling liquid clearing disconnect system in normal operation.

FIGS. 19A, 19B and 19C illustrate an example connector valve 1901 as discussed above, further comprising an example latching system 1905, 1915. The valve 1901 is shown in operation in a latched open position 1900, in a latched intermediate position 1900', and in a closed unlatched position 1900". Such a connector 1901 will allow air to enter the computer/server with liquid cooling 1910 through a port 1920 as the valve 1901 is pushed down into the intermediate position 1900'. If the server 1910 has a minimum volume of cooling liquid 12, the server 1910 may be purged of cooling liquid 12 in less than one second while in the intermediate position 1900'. Once the cooling liquid 12 is purged from the server 1910, it is also purged from the bottom chamber 1940 below the lower valve 1930. Once the cooling liquid 12 is purged from the bottom chamber 1940 below the lower valve 1930, the lower valve 1930 moves to the bottom of the bottom chamber 1940 and the valve 1901 moves to the closed position 1900", thereby closing the air port 1920 as well as the plumbing 4, 5 for the cooling liquid 12. The movement of the lower valve 1930 to the bottom of the lower chamber 1940 also moves downward a connected latching mechanism 1905 that thereby disengages a corresponding latching mechanism 1915 that is connected with the server 1910. The disengagement of latching mechanisms 1905, 1915 allows the connector valve 1901 and plumbing 4, 5 connected thereto to be removed from the server 1910 without leakage of cooling liquid 12, for instance if component repair or replacement is required. A small amount of air may be pulled into the system during this process, but it will be automatically evacuated and pumped out by the vacuum pump(s), e.g., vacuum pump 8.

Each computer or server or server rack with a liquid heat exchanger 1 may be connected with the present dry disconnect system that allows for the automatic draining of the heat exchanger 1 as described above. Such connectors may include supply and return flows. Supply and return flows may be coaxial, in order to allow for a small interconnect. The system is preferably designed to remove all of the cooling liquid from inside each heat exchanger subsystem 1 such as a CPU, server or server rack during the disconnection process. For example, if the heat exchanger 1 contains one cc of cooling liquid 12, and the flow rate is 150 cc/minute of cooling liquid, then it will take less than 1 second to drain the cooling liquid out of the computer or server or server rack with a liquid heat exchanger 1. As the cooling liquid 12 is replaced by air, the flow resistance of the heat exchanger decreases, so the process may happen in less than 0.5 seconds.

6.3 Example Turbulator Designs

Figure 2:
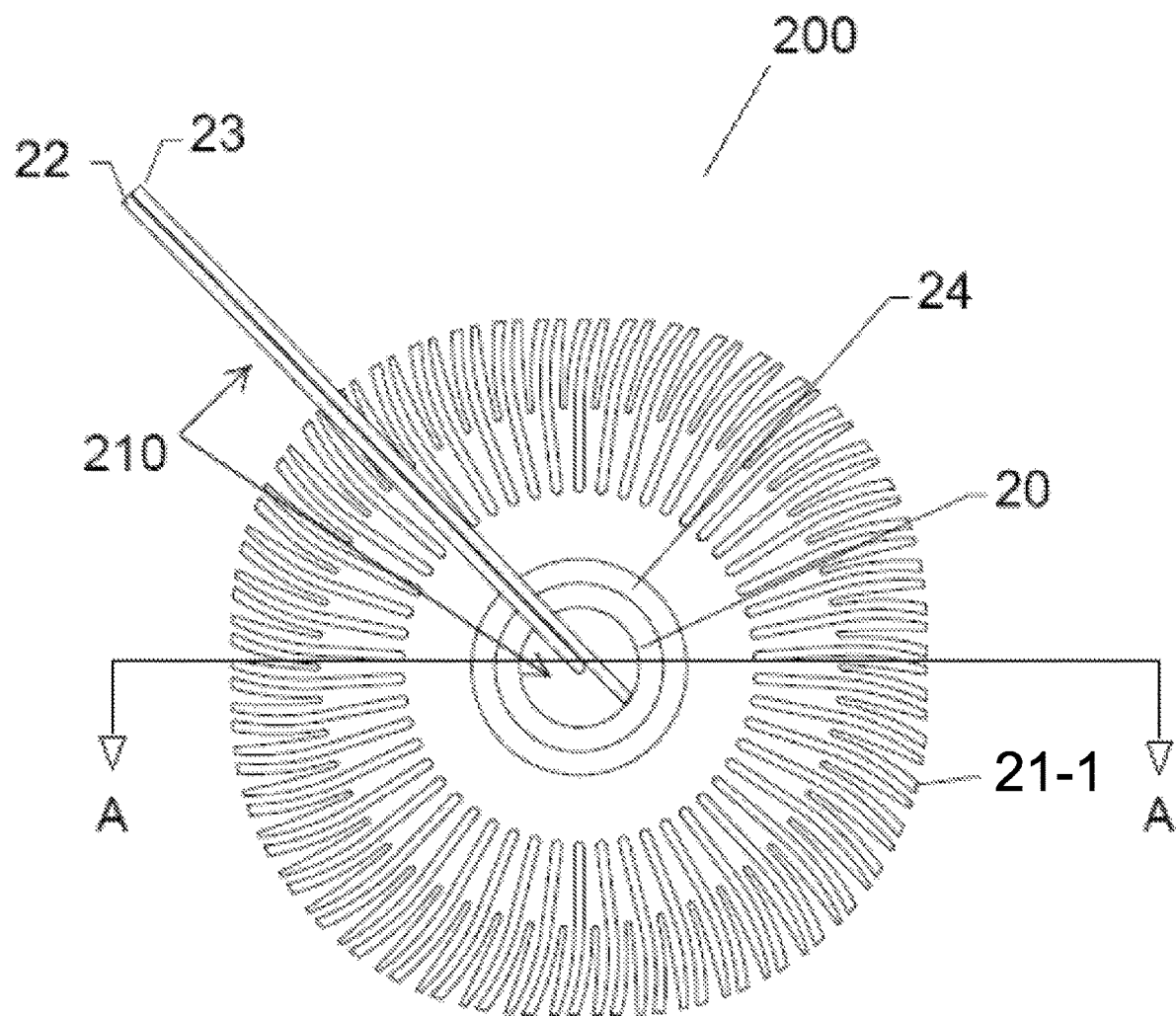
FIG. 2 is a top plan view of an example air and cooling liquid-cooled heat exchanger incorporating a turbulator.

Referring to FIG. 2, an example air and cooling liquid heat exchanger 200 may comprise a cooling liquid cooling portion 210, which includes inlet tube 22 and outlet tube 23 to provide cooling liquid (not shown) to a turbulator 400 (shown in more detail in FIGS. 3A, 3B and 4, its top surface 20 being visible in FIG. 2), and a metal heat spreader 24 that is in thermal contact with the electronic device 1820 (shown in FIG. 18) on one side and is in thermal contact with the cooling liquid on the other side. A series of fins 21-1 are provided in thermal contact with flowing air in the event that the liquid cooling system is not operational. A fan 1840 (shown in FIG. 18) would typically be used in proximity to the fins 21-1 to provide cooling air. A turbulator 400 fits inside the metal heat spreader 24 and reduces the amount of cooling liquid needed to cool the device and increases the velocity and turbulence level in the cooling liquid. In this example air and cooling liquid heat exchanger 200, the cooling liquid inlet 22 may be adapted to provide a point of jet impingement cooling closest to the heat source, for instance near surface 20, as best seen in FIGS. 2, 3A, 3B and 4, to flow the cooling liquid in a helical path 25 through the turbulator 400 to the outlet tube 23. In some cases a portion of the cooling liquid flow may flow over the helical flow passages 25 through a clearance space between the turbulator 400 and the metal heat spreader 24 as best shown in section view 300. This "leakage" of cooling liquid flow over the edges of helical flow passages 25 may enhance heat transfer by causing turbulence and swirl within the helical flow passages 25.

Figure 3A:
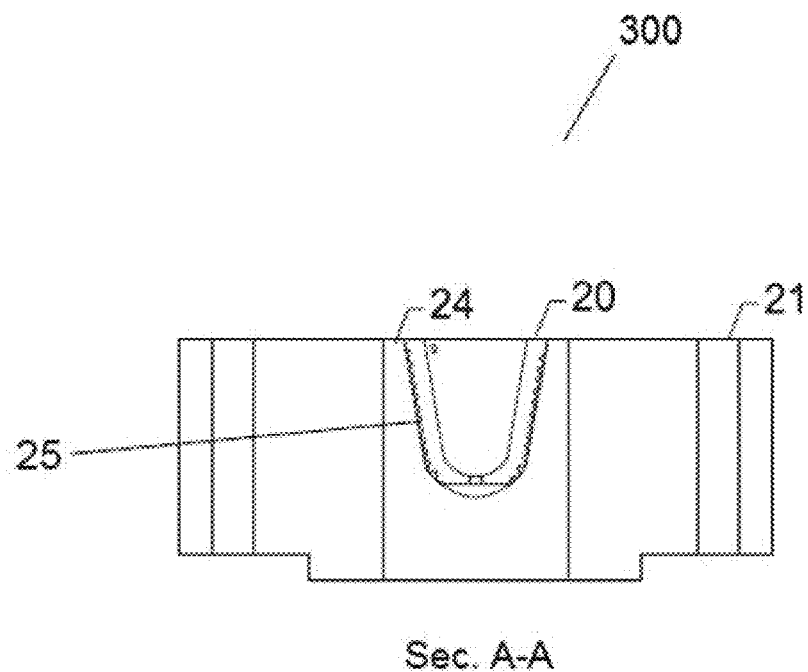
FIG. 3A is a partial section view of the example air and cooling liquid-cooled heat exchanger with a turbulator of FIG. 2.
Figure 3B:
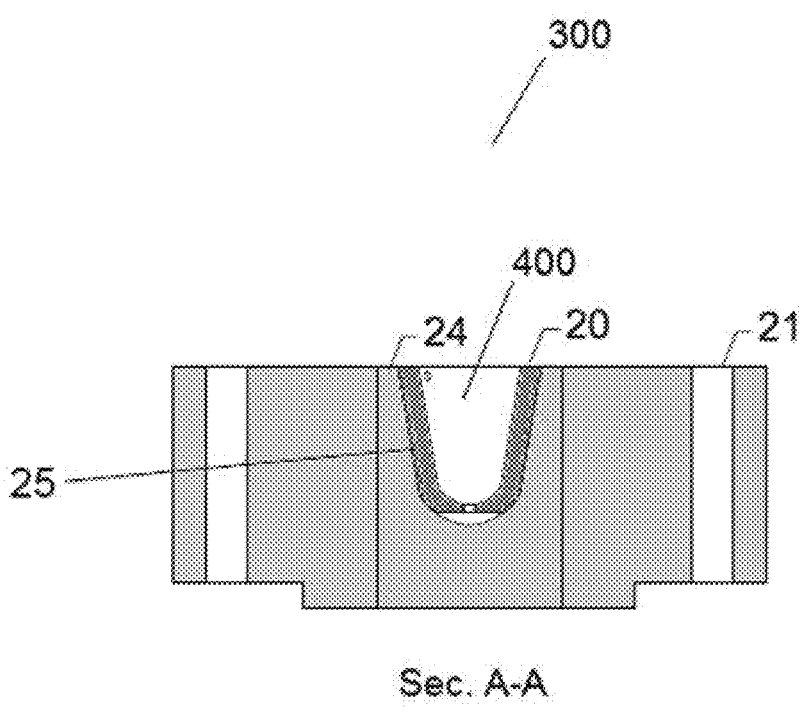
FIG. 3B is a partial section view of the example air and cooling liquid-cooled heat exchanger with a turbulator of FIG. 2.
Figure 4:
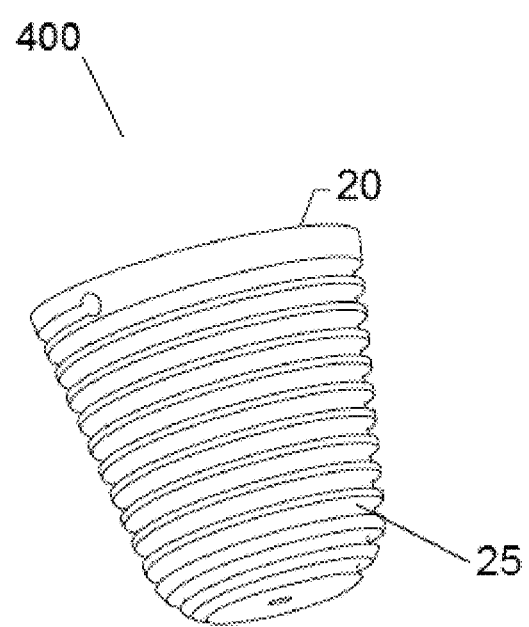
FIG. 4 is a perspective view of the example turbulator of FIGS. 2, 3A and 3B.

FIG. 3A shows a partial cross-sectional side elevation view 300 of the air and liquid heat exchanger 200 shown from the top in FIG. 2. The turbulator 400 can be seen installed in FIG. 3B in the heat spreader 24, and providing a narrow helical path or passage 25 for the cooling liquid. The CPU is not shown in this view; it would normally be attached to the bottom or lower portion of the heat spreader 24 as shown in cross-sectional side elevation view 300. In other embodiments the CPU or other heat source could be located proximate to the upper portion of the heat spreader 24, for instance near surface 20. FIG. 4 provides an isometric view of the turbulator 400, which shows the helical flow path 25 more clearly.

Figure 11:
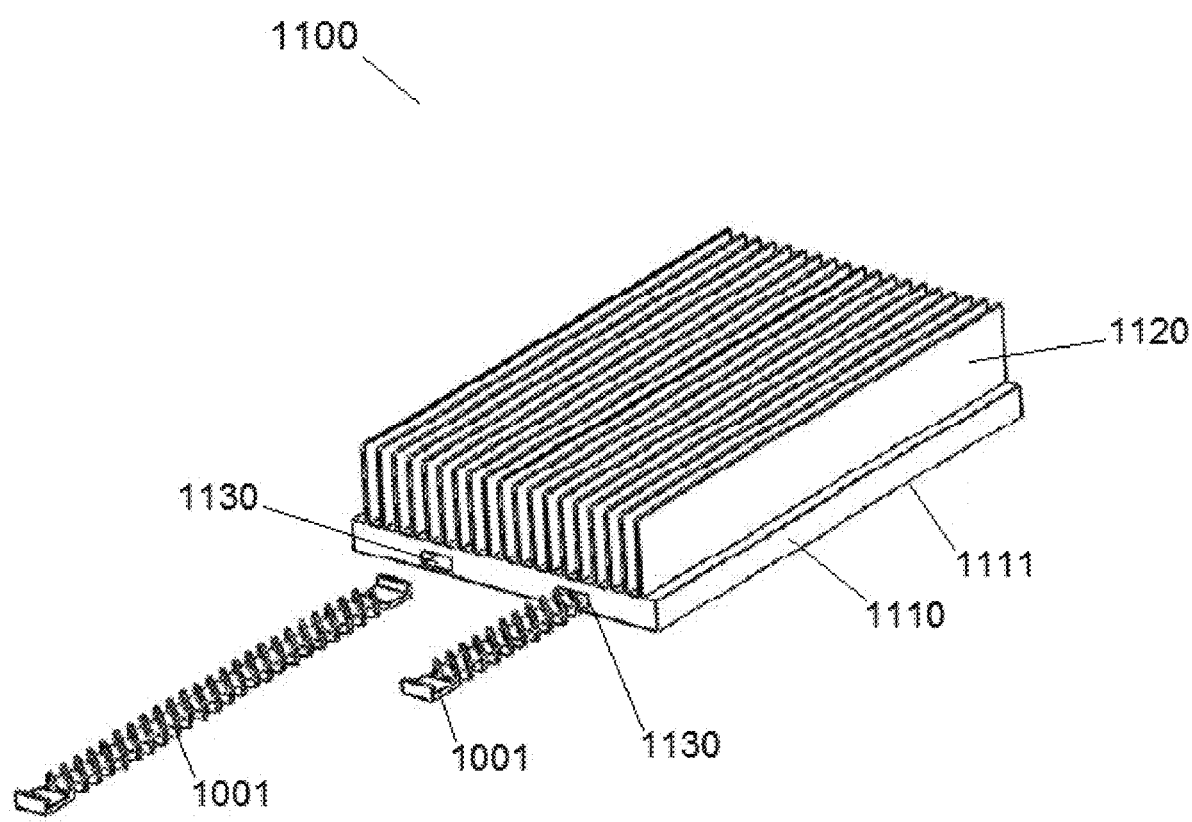
FIG. 11 is a perspective exploded view of an example air and cooling liquid cooled heat exchanger with turbulators positioned near the primary heat source.

With reference to FIG. 11, a liquid-cooled heat exchanger 1100 is preferably mounted to a CPU (1820, shown in FIG. 18) and may comprise one or more passages 1130 with turbulators 1001 to increase the velocity and turbulence of the cooling liquid 12 near the heat transfer surface 1111. The turbulator 1001 may also be designed to minimize the volume of cooling liquid 12 contained within the heat exchanger 1100 so that the cooling liquid 12 may be quickly cleared for repairs. The CPU 1820 typically includes an air-cooled heat exchanger with fins 1810 and a fan 1840 located nearby to provide air-cooling. The fan 1840 may be controlled by the temperature of the CPU 1820 so that as it gets hotter, the fan speed increases. The flow rate of the cooling liquid 12 may be determined by the acceptable temperature rise of the liquid and the power dissipated by the CPU 1820. For an example CPU that generates 100 watts, a stream of cooling liquid at 150 cc/minute may result in a temperature rise of approximately 10 C. The temperature differential from the CPU case to the cooling liquid should be of the same order as the temperature rise. The heat exchanger 1100 in that example may be selected to have a pressure drop of approximately 4 in Hg so that the system 100 will work properly on a hot day in a high altitude location, where the difference between the local atmospheric pressure and the vapor pressure of the hot cooling liquid may be only about 8 in Hg.

The heat exchanger 1 may incorporate a helical flow pattern for the cooling liquid 12 to put a long path into a short passage to increase heat transfer. This helical flow passage may have multiple starts and paths, as shown in FIG. 10E, so as to allow for increased flow in a small passage. This may also be accomplished by placing a threaded rod, such as shown in FIG. 10D, in a metal tube so that the flow must take a long path through the heat exchanger at a high velocity. This has the added benefit of reducing the volume of cooling liquid in the heat exchanger 1, thereby reducing the amount of cooling liquid 12 that needs to be cleared to service the heat exchanger 1. Alternatively, a rod with a tortuous path in relief may be used to displace fluid in the center part of the passage and thereby increase the cooling liquid flow and turbulence, as shown in FIG. 10.

The rod and cylinder may be square, cylindrical, conical, triangular, hexagonal, or any other appropriate shape. The rod or other turbulator structure may be designed so that some of the cooling liquid 12 flows over the edge 1004 of flow passages 1005 in an axial direction, for instance directly from a proximal end 1002 to a distal end 1003 of the turbulator 1001 shown in FIG. 10A. This axial flow may interact with the helical flow in channels 1005, 1006 to provide swirl or turbulence in the heat transfer passages in order to increase heat transfer. This is shown in FIG. 10G and discussed further below. In addition, the axial flow will reduce the flow resistance/pressure drop of the heat exchanger 1. This arrangement may be particularly useful in situations where the flow of cooling liquid 12 would otherwise be laminar or nearly laminar. In some installations, a flat plate heat exchanger may be used. For high power dissipation systems, or for additional reliability, multiple parallel turbulators may be used.

Figure 10:
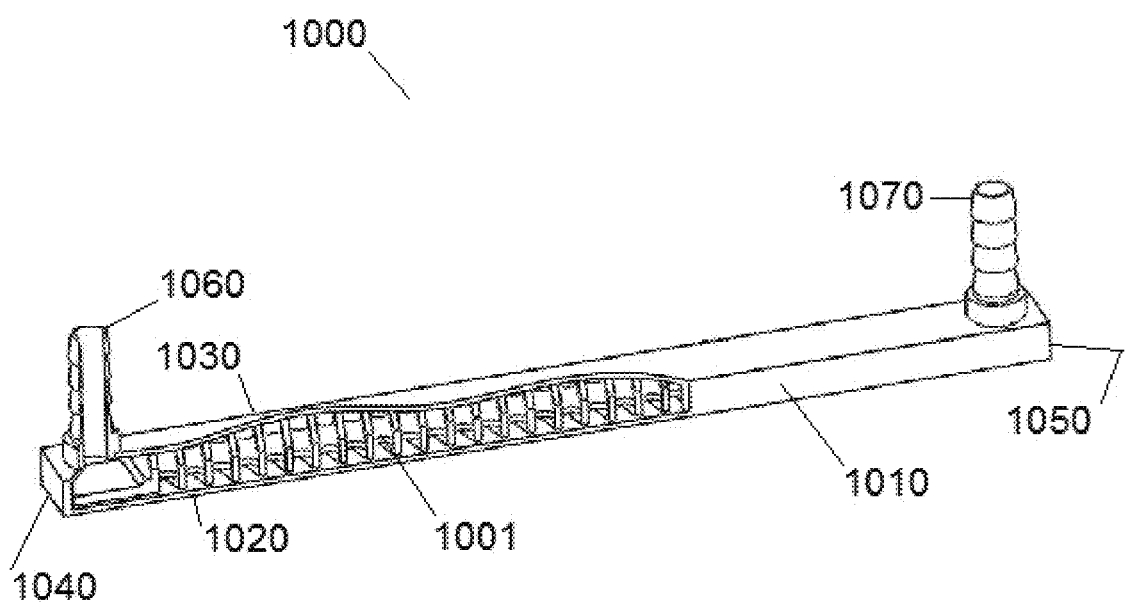
FIG. 10 is a perspective view of a turbulator assembly comprising a single-entry flow passage turbulator having a rectangular cross-section and positioned inside a flow channel, partially cut-away.
Figure 10A:
FIG. 10A is a top plan view of the turbulator of FIG. 10.
Figure 10B:
FIG. 10B is a side elevation view of the turbulator of FIG. 10.

For example, referring to the embodiment shown in FIGS. 10, 10A and 10B, a turbulator system 1000 may include a turbulator 1001 with ridges 1004 and troughs 1005 defining a flow passage between the turbulator 1001 and the interior of a hollow body or tube 1010, for instance a helical flow passage, that forces cooling liquid 12 flowing from a first end 1002 to a second end 1003 of the turbulator 1001 to flow diagonally across one face 1020 of the interior of the hollow body 1010, and then across to the other side 1030 of said passage, where the flow goes diagonally across and then back to the previous side 1020, and then repeats this helical flow pattern from a proximal end 1040 of the hollow body 1010 to a distal end 1050 of the hollow body 1010. The flow passage may be fed with a fitting 1060, which may include a hose barb. The flow passage may likewise be drained with a fitting 1070, which may include a hose barb.

Figure 10C:
FIG. 10C is a top plan view of a turbulator with a rectangular cross-section and a double-entry flow passage.
Figure 10D:
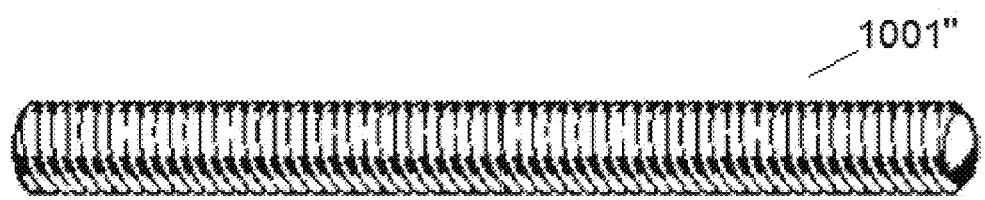
FIG. 10D is a top plan view of a turbulator with a circular cross-section and a single-entry flow passage.
Figure 10E:
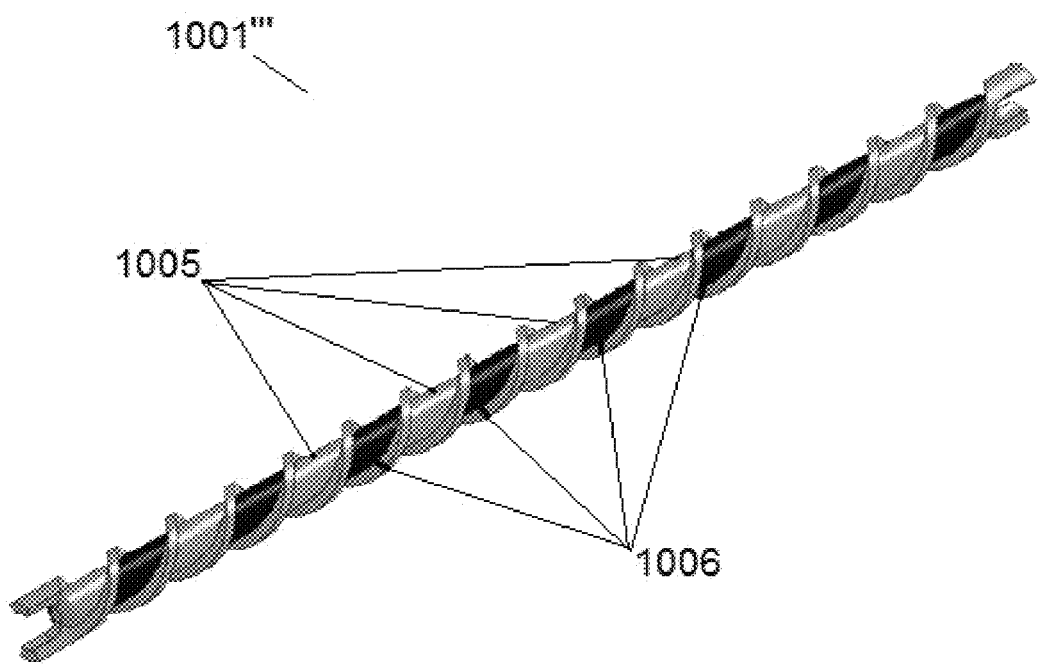
FIG. 10E is a perspective view of a turbulator with a circular cross-section and a double-entry flow passage.

Referring to the example embodiment shown in FIG. 10C, an alternate turbulator 1001' forms a double-entry helical flow path. This rectangular cross-section design allow for more flow at a given pressure than the rectangular cross-section design in FIGS. 10, 10A and 10B, in that it defines two parallel flow paths. The use of two paths, instead of one larger path, increases the velocity of the fluid and tends to make the device resistant to clogging. Also, the dual path reduces the tendency of the flow to short circuit over the top of ridges 1004, thus maintaining the flow in thermal contact with the heat exchange tube 1010 and increasing cooling efficiency.

In the example embodiment shown in FIG. 10D, a circular cross-section turbulator 1001" is provided for use inside of a corresponding circular cross-section tube (not shown). This may be easily constructed in certain embodiments by placing a threaded rod 1001" in a tube with a close tolerance. This type of design lends itself to use in some of the embodiment described below, in which the liquid flow path is embedded in the fins of a heat exchanger in order to reduce the thermal resistance to the air.

FIG. 10E illustrates yet another type of turbulator 1001''' with a circular cross-section. Like the rectangular cross-section embodiment shown in FIG. 10c, the circular cross-section turbulator 1001''' in FIG. 10E forms a double-entry helical flow path. To illustrate these paths, FIG. 10E has lighter shading 1005 that illustrates one flow path, and darker shading 1006 illustrating the independent second flow path. This design provides more flow at a given pressure than the design in FIGS. 10, 10A and 10B, in that it uses two parallel flow paths. The use of two paths, instead of one larger path, increases the velocity of the fluid and tends to make the device resistant to clogging. Also, the dual path and circular cross-section reduces the tendency of the flow to short circuit over the top of ridges 1004, thus maintaining the flow in thermal contact with the heat exchange tube 1010 and increasing cooling efficiency.

The design of turbulators shown in FIGS. 10A, 10B, 10C, and 10E all have a core that is concentric to the passageway in which the turbulator is installed. Radiating away from the core are fins or ridges that create the channels in which the coolant flows. FIG. 10F illustrates a cross-section that is perpendicular to the longitudinal axis of the turbulator 1001"", while FIG. 10G illustrates a cross-section that is parallel to the longitudinal axis of the turbulator 1001"". The turbulator core is labeled 1070 and the fins/ridges 1072. The core effectively reduces the cross-sectional area of the passageway and forces the coolant through the turbulator at a higher pressure. While this obstruction of the turbulator causes an increase in the pressure drop, it has the benefit of causing the coolant to flow in a highly turbulent fashion which increases the heat exchange with the coolant. The cross-sectional area of the core relative to the passageway may be greater than 20%, but more preferably at least 40 percent. Further, the turbulator may be designed such that the fins/ridges intentionally allow flow or leakage from one channel to an adjacent channel. While at first blush this may seem to reduce efficiency, it actually causes the coolant to experience even more turbulence by creating swirls that are perpendicular to the flow in the helical channel, which increases the heat transfer to the coolant. FIG. 10 H illustrates a turbulator 1001'''' traveling through a heat sink 1074, with FIG. 10I showing an enlarged view of the turbulator 1001''''. The turbulator 1001'''' has helical channels 1075 (shaded dark gray) and 1076 (shaded light gray) that are adjacent to each other. Because ridge 1078 is designed to allow leakage, a swirl 1080 is created that is substantially perpendicular to the helical channel flow shown by arrow 1082. The central core of the turbulator may consist of baffles, which reduce the flow velocity instead of solid material. This achieves the goal of increased heat transfer, but it adds unnecessary fluid to the system.

6.4 Example Heat Sink Designs

Referring to FIGS. 11 and 18, in the embodiment shown in FIG. 11 heat exchanger tubes 1010 are soldered into slots 1130 in the base plate 1110 of the heat sink 1100, thereby reducing the thermal resistance from the CPU 1820 (located adjacent surface 1111) to the liquid. The turbulators 1001 enhance the heat transfer from the liquid 12 to the base of the heat sink 1111 and to the top of the CPU 1820.

Figure 12:
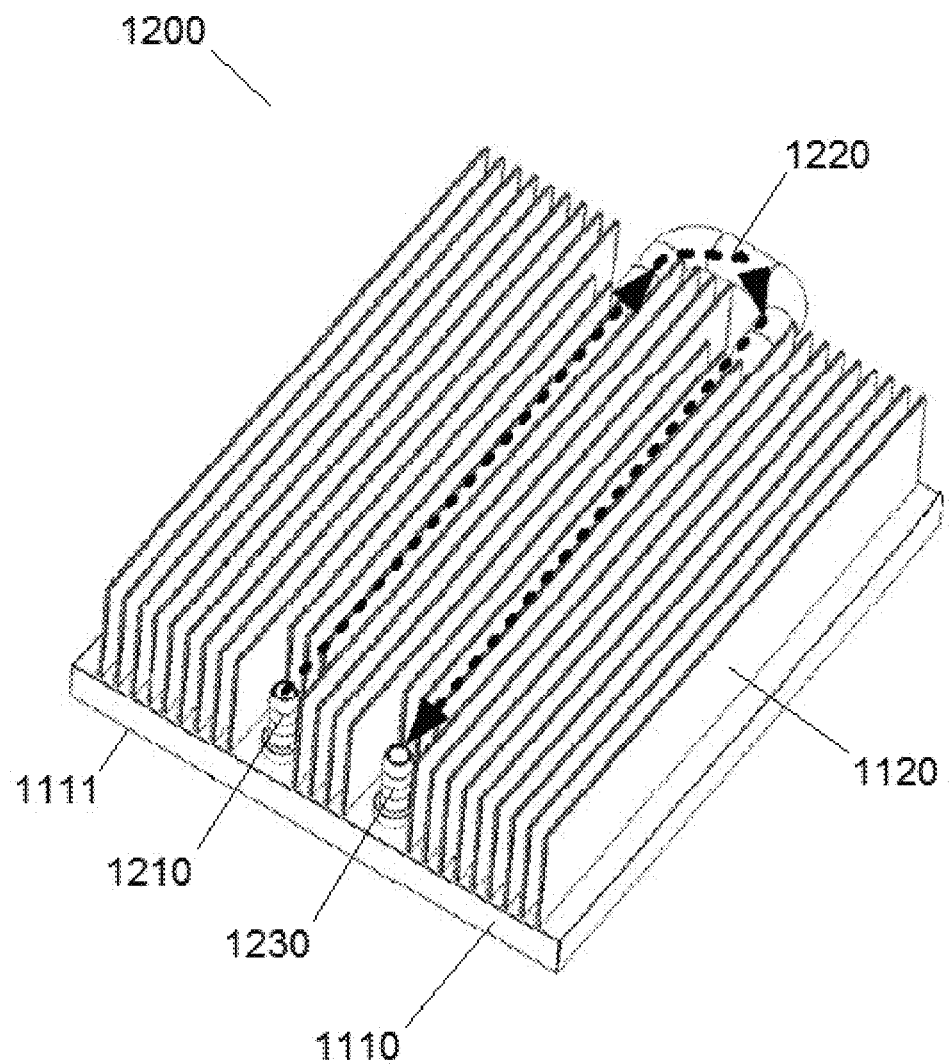
FIG. 12 is a perspective view of an example air heat exchanger retrofitted to become an air and cooling liquid cooled heat exchanger.

Referring to FIG. 12, a fluid supply fitting 1210, heat exchanger tube 1010 and fluid return fitting 1230 are added to the heat sink 1200 so that the cooling system can be connected to a fluid cooling system without affecting the mechanical attachment of the heat sink 1200 to the CPU 1820 or circuit board. The path of the heat exchange tube(s) 1010 is shown by dashed line 1220. Heat sink 1200 can be created from an existing non-liquid heat sink without changing the footprint of the heat sink by removing a few fins 120 and adding one or more heat exchanger tubes 1010 with fluid connections 1210, 1230.

Figure 13:
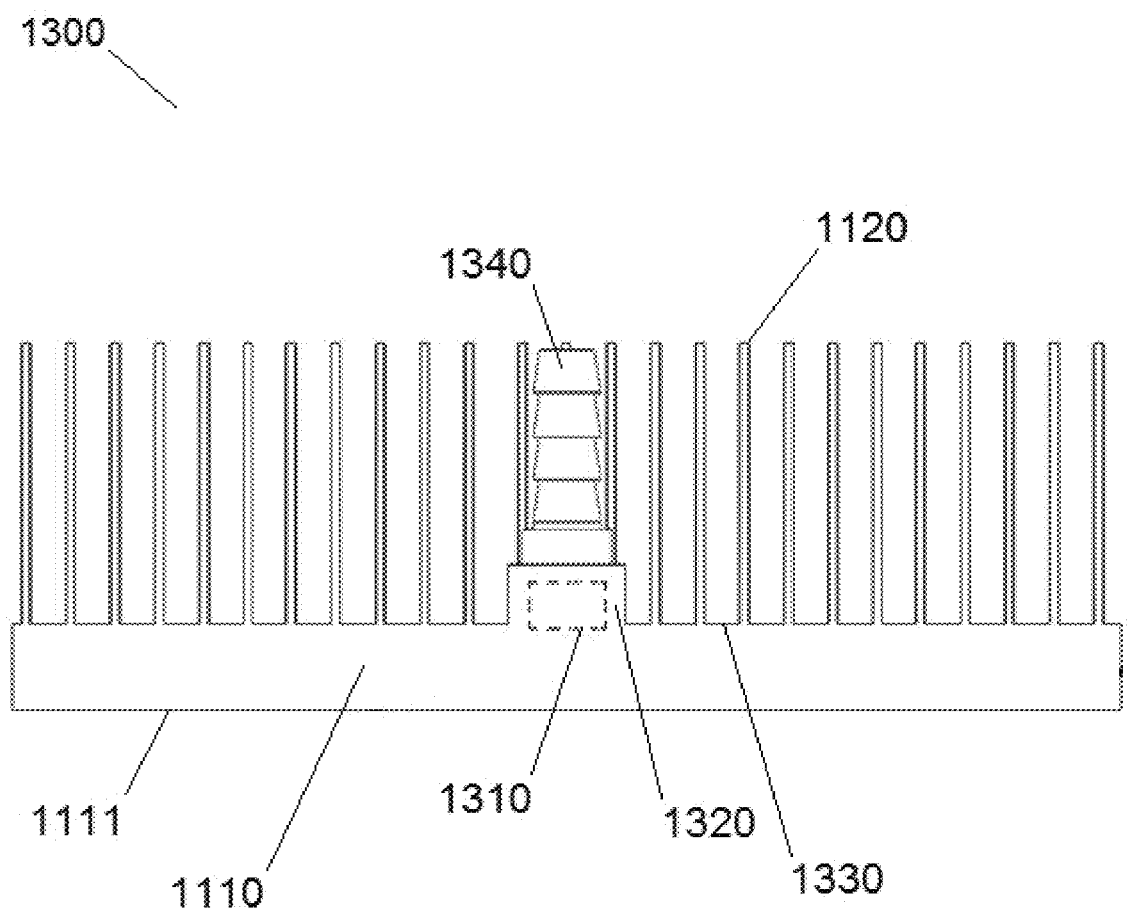
FIG. 13 is a side elevation view of an example air and cooling liquid cooled heat exchanger with a turbulator positioned further from the primary heat source.

Referring to FIG. 13, in this example embodiment the heat exchanger tube 1320 is positioned on the top surface 1330 of the base plate 1110 of the heat sink 1300. In this configuration, the thermal resistance from the CPU 1820 (located adjacent to surface 1111) to the liquid coolant 12 (running through tube 1310) is greater than in the design shown in FIG. 11. At the same time, the thermal resistance from the liquid to the air in heat sink 1300 is reduced compared to heat sink 1100.

Figure 14:
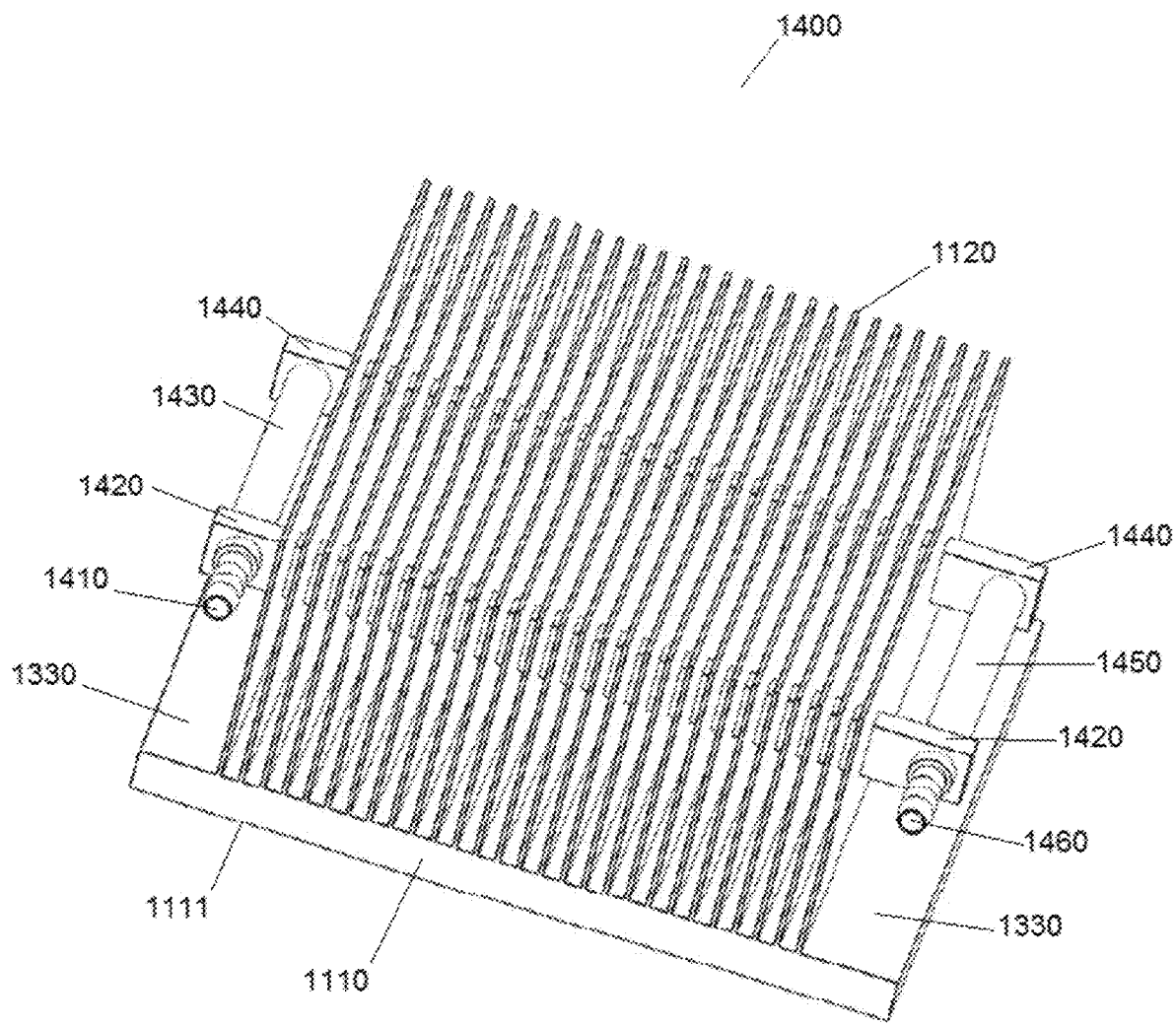
FIG. 14 is a perspective view of an example air and cooling liquid cooled heat exchanger with turbulators positioned in the fins.

Turning to FIG. 14, in heat sink 1400 the heat exchanger tubes 1420, 1440 are placed in the fins 1120, still further away from the base plate 1110 than in heat sink 1300. This further increases the thermal resistance from the CPU 1820 (located adjacent to surface 1111) to the liquid coolant 12 (running through tubes 1420, 1430, 1440 and 1450), and further reduces the thermal resistance from the liquid coolant to the air. The various example heat sink designs 1100, 1200, 1300 and 1400 demonstrate that the distance from the bottom 1111 of the base plate 1110 to the tubes 1010, 1130, 1320, 1420, 1440 may be adjusted in order to adjust and balance the thermal resistance from the liquid coolant 12 to the air (through fins 1120) and from the CPU 1820 (adjacent surface 1111) to the liquid coolant 12.

6.5 Design Optimization

Figure 15:
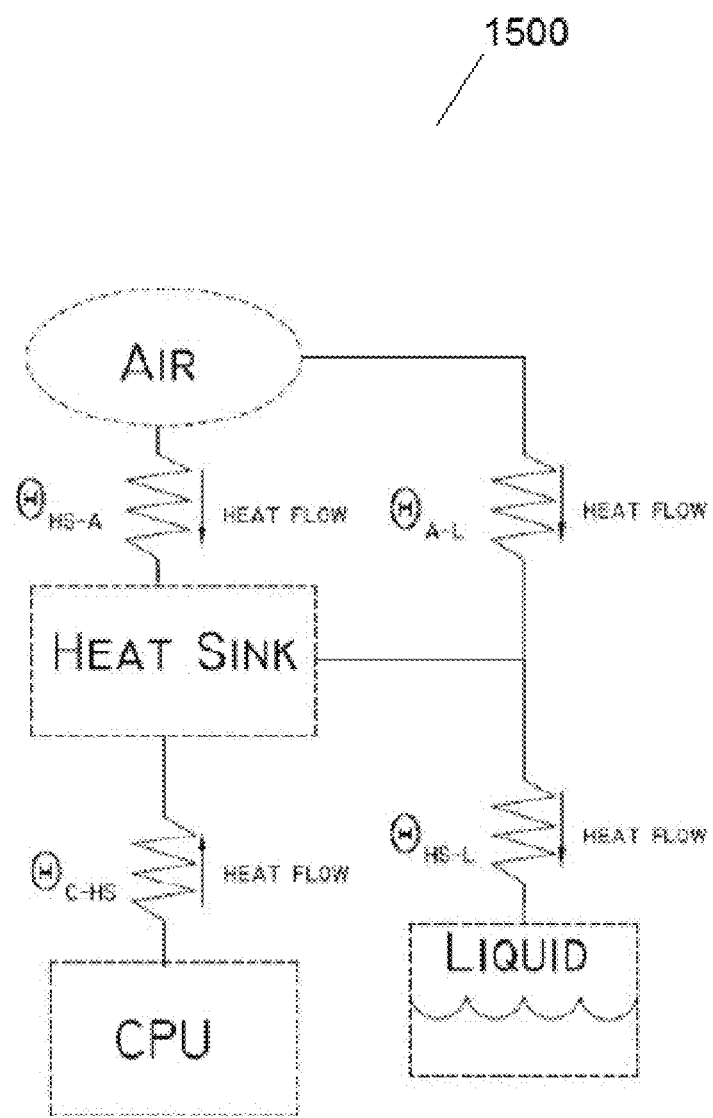
FIG. 15 is a diagram showing heat flow relationships in an example server environment that uses a liquid and air cooled heat exchanger.

A thermodynamic model of these competing thermal resistances is shown in FIG. 15. In model 1500, the relationship of the thermal resistance from the CPU to the liquid and the air, and from the air to the liquid, is illustrated. By means of the prior embodiments, the thermal resistance from the heat sink 1810 to air, the CPU 1820 to the heat sink 1810, the heat sink 1810 to the liquid 12 and the air to the liquid 12 may be adjusted and optimized to minimize overall total power consumption, including that of the entire data center.

For example, increasing the number or area of the fins 1120, may decrease the thermal resistance from the heat sink 1810 to the air. The thermal resistance from the air to the liquid 12 may be decreased by placing the liquid heat exchanger tubes 1420, 1440 closer to the center of the fins 1120. For instance, an example air cooled heat exchanger may have a thermal resistance of 0.15 C/watt. The liquid cooled heat exchanger may have a thermal resistance of 0.05 C/watt. By adjusting the position of the cooling liquid-cooled heat exchanger within the assembly the thermal resistance from the air to the cooling liquid and the CPU 1820 may be suitably controlled so as to provide optimal cooling for the air in the data center and the CPU chip. In some cases, multiple passages may be used to cool both the fins and the processor. Heat pipes and any other thermal structures may also be used to control the flow of heat in connection with the present systems, as will be apparent to persons of skill in the art upon reviewing this disclosure.

The fan 1840 that is typically connected to the CPU heat exchanger may also be used to cool the interior of the computer by transferring heat from the air inside the computer to the cooling liquid 12 so that other components within the server enclosure may be cooled with or without the use of external air flow—i.e., the computer may be sealed. The speed of the fan 1840 may be adjusted to remove additional heat from the air inside the server enclosure of the data center as required to minimize the overall power consumption of the data center. The overall power consumption versus fan speed may be determined based on the power consumption of the air conditioning system versus temperature in the data center and the power consumption of the CPU 1820 versus its temperature. The CPU 1820 uses additional power depending on the temperature of the processor due to leakage currents, with the leakage currents increasing exponentially with the processor at the higher temperature range. For example, CMOS-based processors use more energy as the temperature of the processor goes up, due to leakage currents. Also, the air conditioning system of the data center uses additional power depending on the temperature of the data center and the building heat removal requirements. This increase is generally linear; with higher temperatures requiring proportionally higher air conditioning power. By controlling and selecting the optimal speed of the CPU fan 1840, the flow rate of liquid 12 through the heat exchanger 1, and the position of the liquid heat exchanger tubes 1010, 1130, 1320, 1420, 1440 in the overall assembly consisting of a base 1110 and fins 1120, the overall power required for the data center can be decreased. Examples of these relative flows of heat between the various components are depicted by the wavy arrows in FIGS. 17A and 17B, and may be analyzed and optimized using an electrical analog, as shown in example heat flow diagram 1500 in FIG. 15.

Figure 17:
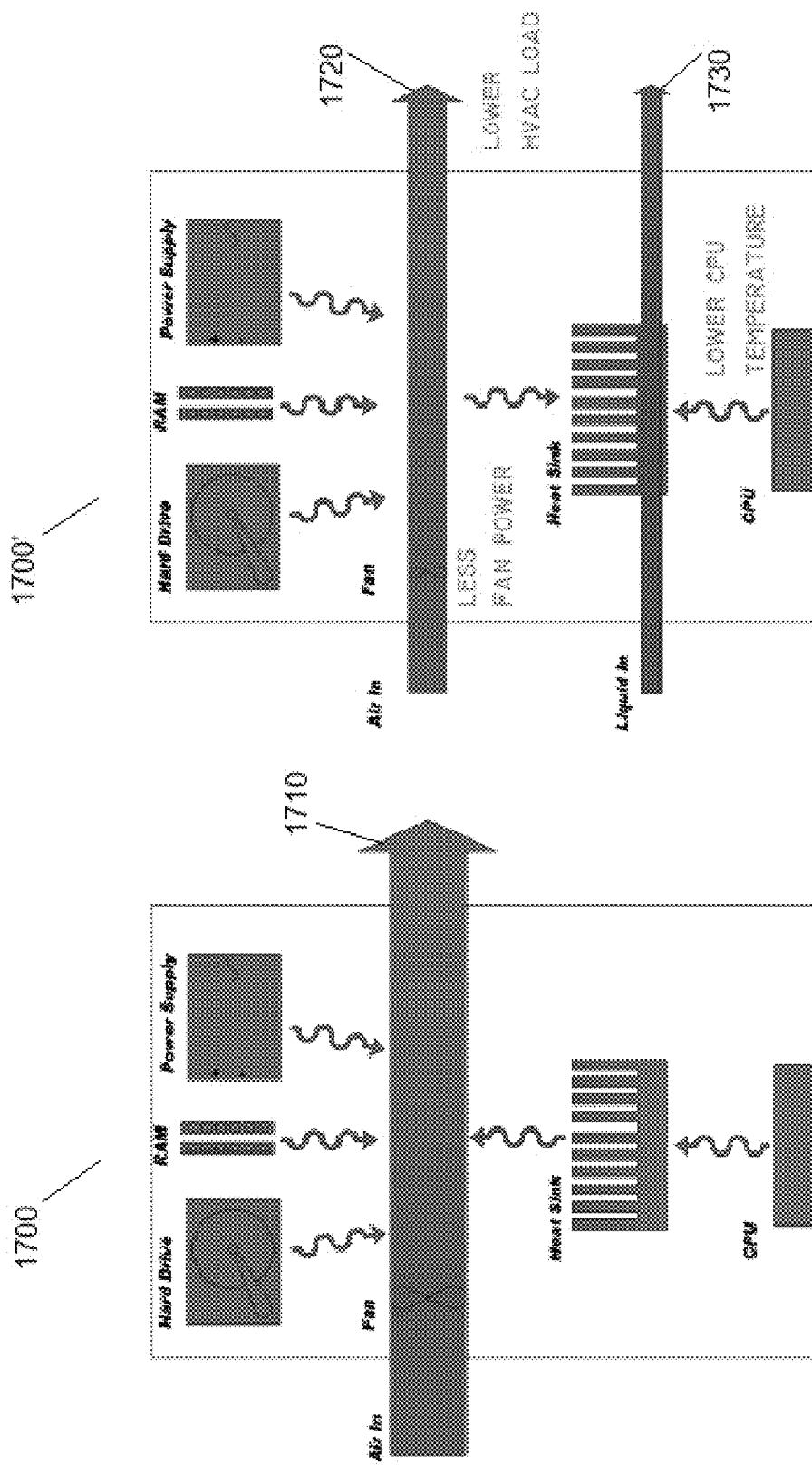
FIG. 17A is a heat flow diagram depicting the heat flow in an example system using only air cooling.
FIG. 17B is a heat flow diagram depicting the heat flow in an example system using liquid cooling and air cooling.

With further reference to FIGS. 17A and 17B, it can be seen that the air conditioning system of the data center would use additional power when the computers/servers 1 use air cooling only, rather than air cooling plus liquid coolant that is routed outdoors to cool. This heat load difference is represented by the comparison of the larger heat load 1710 that must be removed from the air of the data center in system 1700 with the smaller heat load 1720 that must be removed from the air of the data center in system 1700'. The difference is represented by heat load 1730 that is removed by the liquid, and is preferably routed outdoors to cool as shown in the foregoing embodiments. A heat sink 1810 for a system that uses an internal liquid cooling passage could be designed to remove heat from other items in the server, such as hard drives, memory chips, and any other heat-generating electronics, as shown in FIGS. 17A and 17B. In these designs, the heat sink 1810 may be selected to be oversized for the CPU 1820, but this will reduce the cooling load on the air conditioning system in the data center by transferring to the liquid coolant not only heat from the CPU 1820, but also heat from the other nearby heat-generating electronics.

6.6 Example Test Results

An example heat exchanger design started with an existing air-cooled system. In order to provide the best cooling with minimum volume and input power, a spiral cooling channel with a Reynolds number just above the laminar limit was used. This is believed to provide the best cooling with a reasonably sized channel that can pass contamination.

For example, if a 140-watt CPU is to be cooled with water, and an 18 degrees F. (10 degrees C.) temperature rise can be accepted, then a flow rate of 220 cc/minute would be needed, based on the heat capacity and mass flow rate of water. Next, rocket science was employed to develop a nozzle cooling system, which in rocket science is done with an array of tubes that cool the nozzle and preheat the fuel on the way to the combustion chamber. The goal there is to adjust the length and diameter of the parallel tube array to get the optimum cooling for a given flow rate. In the present case, the water outlet temperature and the heat sink temperature are desired to be within 1 degrees C. of each other. So a fluid path was selected with a Reynolds number slightly higher than 2100, so that the flow was turbulent, but the pressure drop was not too high. In this example two helical flow passages were used, 0.055 inch (1.4 mm) in diameter. This system was analyzed using empirical heat transfer equations for flow in a tube, modeled using computation flow dynamics (CFD), and tested with a Xeon processor running stress software. The thermal resistance heat sink to water, based on the temperature of the water into the heat sink, was 0.04 watt/degrees C. with 230 cc/minute flow rate per CPU. A similar heat sink design with coolant passages in the base is shown in FIG. 11.

The test heat sink worked exactly as modeled, but when the flow was increased, it was discovered that it could actually remove heat from the entire system. A stack of three DL380 servers was run at idle power levels in an insulated box, and the heat sinks were able to remove all the heat (700 watts) from the computers. In this case the ambient air was 107 degrees F. (42 degrees C.), and the coolant inlet was at 76 degrees F. (22 degrees C.).

Figure 20:
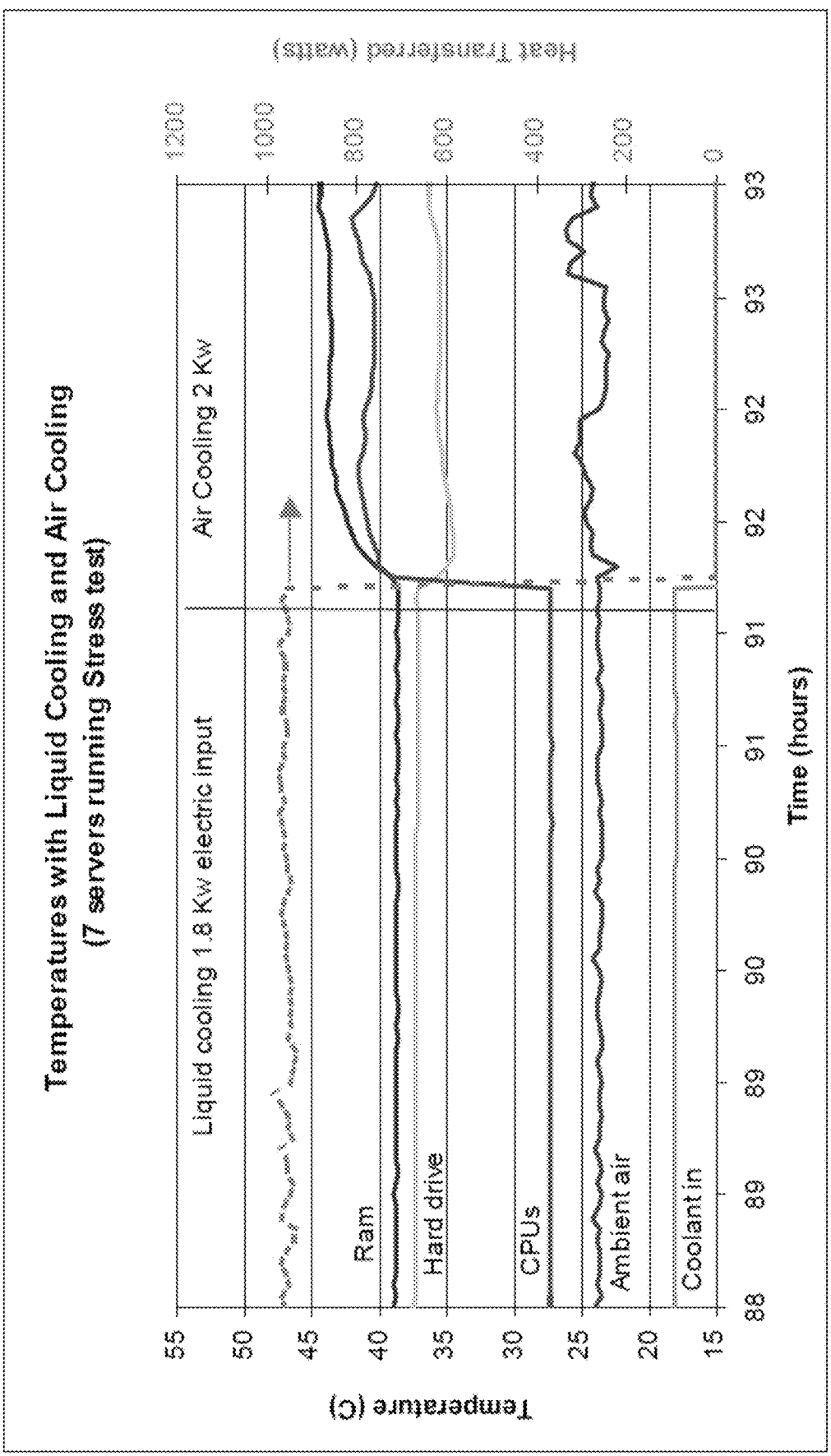
FIG. 20 is a chart of temperature data resulting from tests of example computer cooling systems according to various example embodiments.

Additionally, a test was conducted with a 2 kW rack of servers in an office environment at 75 degrees F. (24 degrees C.) ambient. The servers were either air-cooled or water-cooled using an outdoor miniature cooling tower with water at 65 degrees F. (18 degrees C.). The temperature data is shown in FIG. 20. When the liquid cooling was turned off the HVAC system was not able to keep up, so the door was opened slightly to keep the temperature relatively constant. A set of 7 Servers (3× HP Proliant DL380 G4 2×3.4 Hz and 4 Verari 2U 2× Opteron 245) consumed 2 kW using air-cooling while running a processor stress test program (2 instances of BurnK7). With liquid cooling, and slowed-down fans, the power was reduced to 1.8 kW with 1 kW of heat extracted using the liquid cooling system. In addition, the average processor temperature decreased 25 F (14 C). The hard drives warmed slightly with liquid cooling due to the reduced airflow, but unlike processors, they last longer at warmer temperatures.

Figure 21:
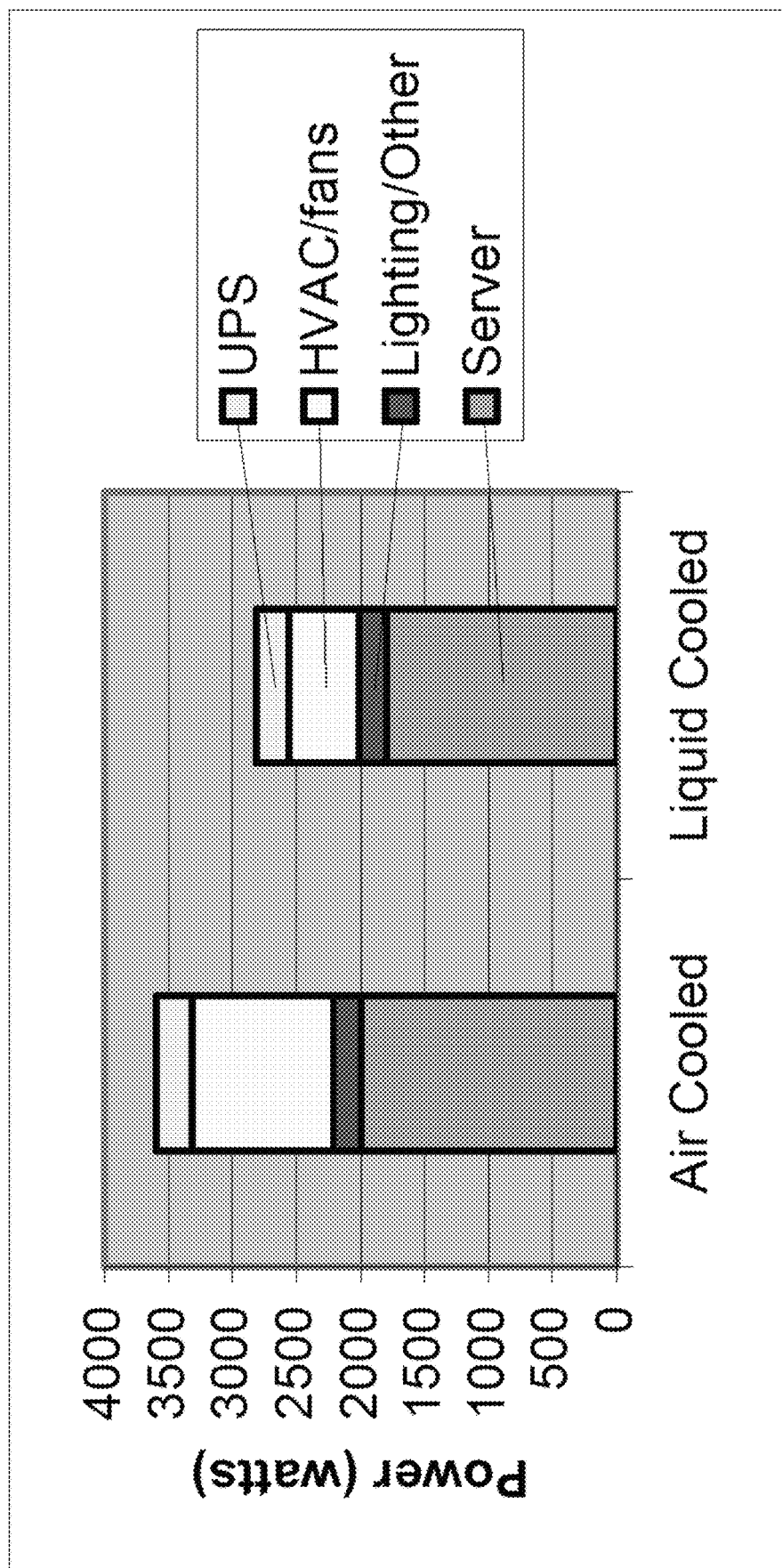
FIG. 21 is a chart of power consumption data resulting from tests of example computer cooling systems according to various example embodiments.

The RAM temperatures were lower with liquid cooling because the RAM chips were located downstream of the heat exchanger. Assuming a typical data center power distribution of 56% Servers, 30% HVAC, 5% UPS and 6% other, the total power required for the original air cooled system would be 3.6 kW (Server Power divided by 0.56). Using liquid cooling allows 1 kW to bypass the HVAC system and go directly outdoors, saving HVAC power. And this has a multiplying energy savings effect, since it takes more than 1 kW of energy for an HVAC system to remove 1 kW of heat. It also saved 10% of the server input power due to lower fan power and because the processors required less power at lower temperatures. The liquid pump and cooling tower fan used only 50 watts. This reduced the overall power consumption based on typical data center power distribution to 2.9 kW, a total power reduction of approximately 20%. The power reduction is diagrammed in FIG. 21. This experiment was done using a miniature cooling tower that was only 52% efficient which lowered the water temperature down to (65 degrees F.) 18 degrees C. in a (50 degrees F.) 11 degrees C. wet bulb environment. A commercial-grade cooling tower with 75% efficiency would be able to reduce the temperature of the cooling water to (59 degrees F.) 15 degrees C. Assuming that the heat removed is proportional to the difference between the ambient and the cooling water inlet, the more efficient cooling tower would boost the heat removal by 50%, leading to a predicted total overall power savings of 25%.

Accordingly, the combination of an air-cooled heat sink modified for redundant liquid cooling, a negative pressure system to prevent leaks, and a connector that automatically purges the coolant adds up to a system that offers a path from the current air-cooled technology to the liquid cooled data center of the future, without having to modify the building. The present liquid-cooled and air-cooled heat sink system reverses the thermodynamics of traditional systems so that the heat sink removes heat from the CPUs and the server interior and the data center in general in order to reduce the HVAC loads and fan power by a large margin.

6.7 Single Vacuum Pump Cooling System

In previously described embodiments, a separate vacuum pump and circulation pump are used to circulate the coolant throughout the system at negative pressure. The embodiment shown in FIG. 22 contains one vacuum pump that both circulates the coolant and creates the negative pressure. The benefit to a single vacuum pump system is that it is less prone to failure and it uses less energy to operate.

Figure 22:
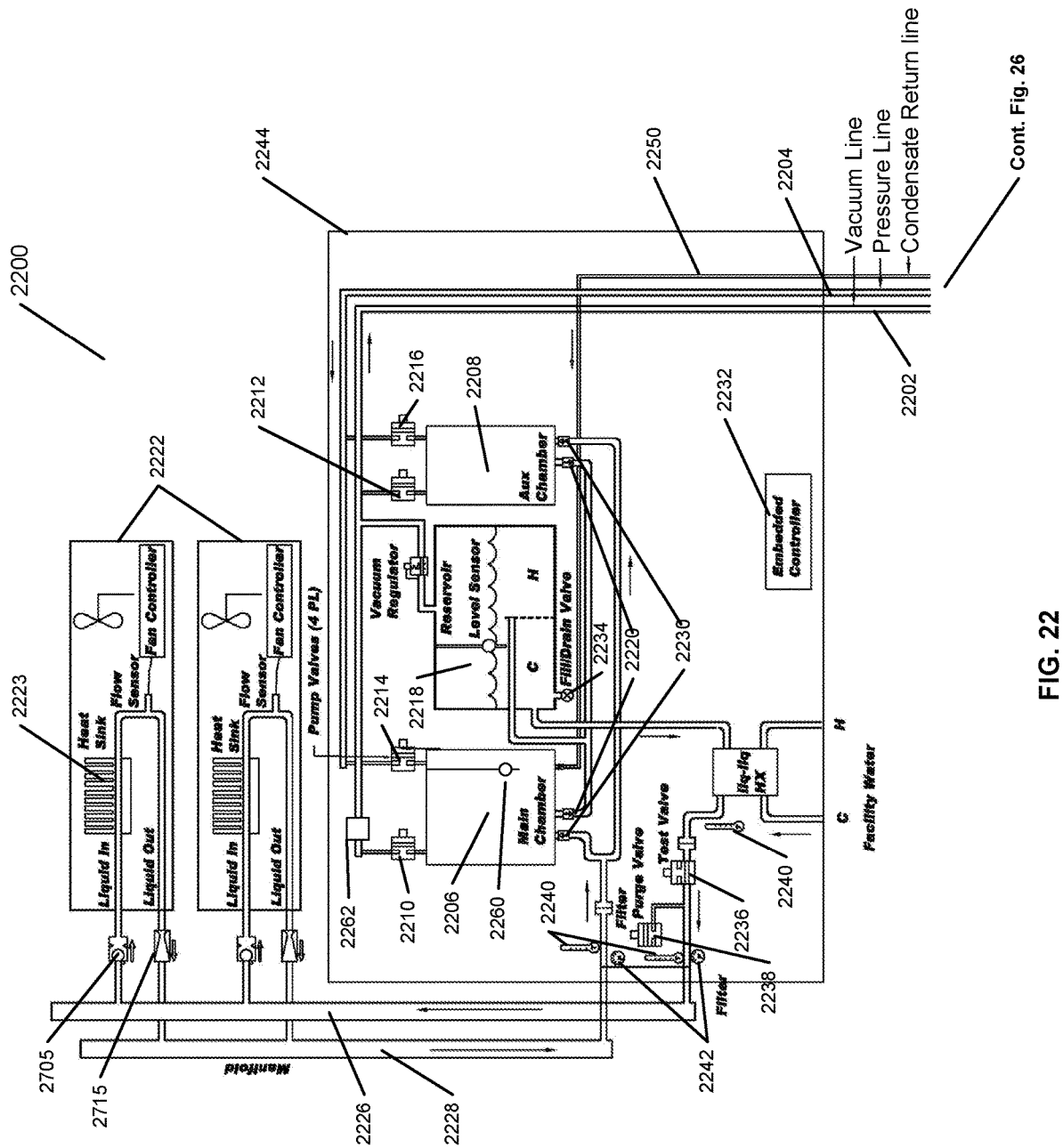
FIG. 22 is a schematic of a single vacuum pump cooling system according to an example embodiment.
Figure 26:
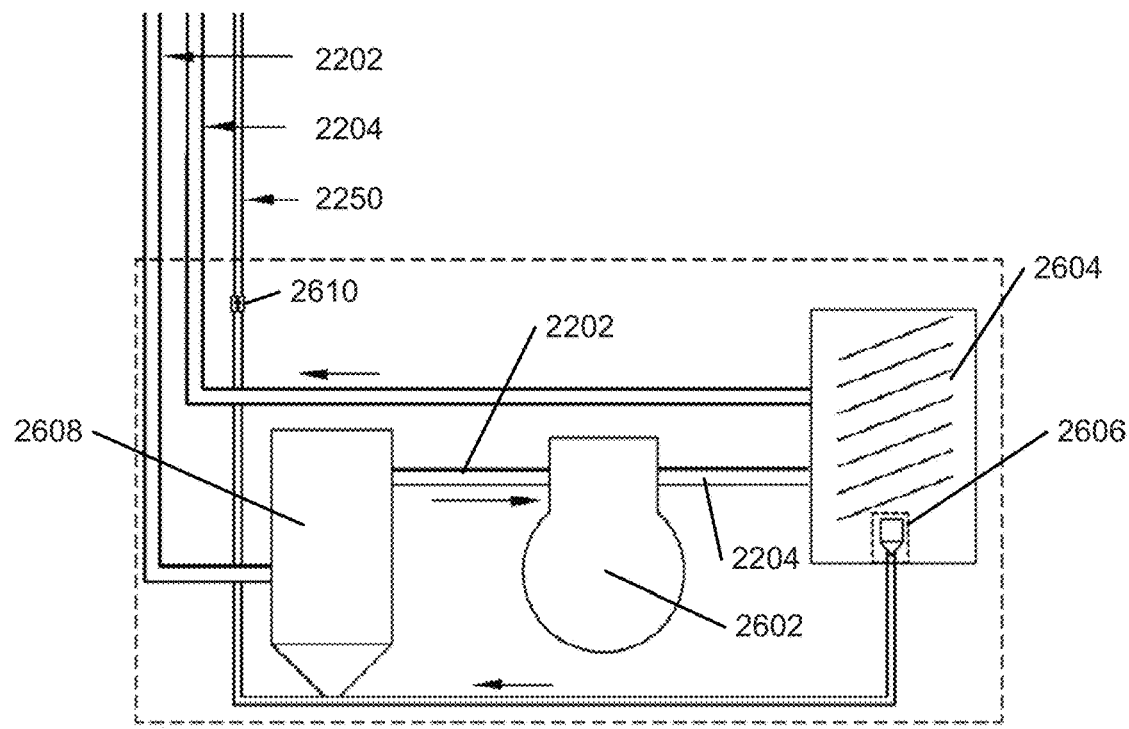
FIG. 26 is a schematic of a single vacuum pump and coolant recovery system according to an example embodiment.

Turning in detail to FIG. 22, a single vacuum cooling system 2200 contains a single vacuum pump that creates a vacuum line 2202 and the system further includes a pressurized line 2204, i.e., a line that is at higher pressure than the vacuum line 2202. The vacuum pump is illustrated in FIG. 26 and discussed below. The vacuum line 2202 is connected to both a main chamber 2206 and an auxiliary chamber 2208, with a valve 2210 regulating the vacuum line 2202 to the main chamber 2206 and valve 2212 regulating the vacuum line 2202 to the auxiliary chamber 2208. The pressure line 2204 is connected to both a main chamber 2206 and an auxiliary chamber 2208, with a valve 2214 regulating the pressure line 2204 to the main chamber 2206 and valve 2216 regulating the pressure line 2216 to the auxiliary chamber 2208. Valves 2210, 2212, 2214 and 2216 make up a valve assembly, and that assembly is controlled by the controller 2232. As described below with reference to FIGS.

23 and 24, switching the valves 2210, 2212, 2214 and 2216 will cause the coolant to circulate throughout the system under negative pressure.

In one embodiment, both the main chamber 2206 and the auxiliary chamber 2208 are connected to the reservoir 2218, such that the coolant can travel in one direction from the main/aux chamber to the reservoir, the one direction travel being accomplished by the use of check valves 2220. The reservoir 2218 is where the coolant is drawn from for circulation to the electronic equipment, shown as servers 2222, and the removal of heat from that equipment through the use of an electronic equipment heat exchanger 2223. The reservoir 2218 connects to the primary heat exchanger 2224 (this can be a liquid-liquid exchanger or an air-liquid exchanger) reducing the temperature of the coolant prior to circulating the coolant via cold manifold 2226 to the servers 2222, and returning the heated coolant via hot manifold 2228 back to the main and auxiliary chambers (2206 and 2208). The coolant from the hot manifold 2228 travels only in one direction to the main and auxiliary chambers (2206 and 2208), the one direction travel being accomplished by the use of check valves 2230. The travel of the coolant throughout the system 2200 is also referred to herein as the coolant circuit.

Alternatively, the main chamber 2206 and the auxiliary chamber 2208 can be connected directly to the primary heat exchanger 2224, completely obviating the need for the reservoir 2218. The reservoir 2218, however, is helpful in equalizing the negative pressure through the system 2200, such that the flow of coolant is more constant and less pulsating. Also, the reservoir 2218 allows the system 2200 to hold more coolant, minimizing the possibility that the system 2200 will run dry.

The system 2200 may also have redundant valves and pumps to reduce the chance of shutdown to a negligible level. One such redundancy system may have two vacuum pumps running at 50% capacity, such that if one fails, the other ramps up to cover the load. This redundancy also imbues the system 2100 with enough vacuum capacity to work with one server completely open to air.

The system 2200 may also have several sensors, filters and structures to help optimize its performance. For example, the reservoirs 2218 may include level sensor to make certain that there is sufficient cooling liquid in the system to meet the demands of the electronic equipment. Filters may be placed throughout the system to remove debris that could interfere with the valves and negatively affect performance. A set of temperature (2240) and pressure (2242) sensors may be placed on the cool manifold and a set on the hot manifold to detect the temperature and pressure difference of the coolant. All the information from these sensors may be fed to the controller 2232. If for example, the system detects insufficient coolant, the system may open the fill valve 2234 to add more coolant and alert the system operator that the coolant level was low. If the pressure sensors detect an abnormal pressure drop, this could signal that there is a leak in the system and the system would alert the operator. Because the system operates under negative pressure, the leak would not expose the computer equipment to the cooling liquid, but rather would introduce air into the system and potentially reduce the efficiency of the system in cooling the computer equipment. To reduce the ability of a leak to compromise the cooling efficiency of the system a novel set of valves and nozzles are used on the hot and cold manifolds, and discussed in greater detail with reference to FIGS. 27A and 27B. The system 2200 may also have a condensation return line 2250 connected to the main or auxiliary chambers, for use in the capture of coolant as described in reference to FIG. 26.

Other valves may be used to further optimize the system. For example, test valve 2236 may be used when the system is first turned on. Test valve 2236 should remain closed until the system detects at the various pressure sensors that the appropriate amount of negative pressure has been reached and maintained. This prevents the system from being activated with leaks present and prevents coolant from circulating to the electronic equipment under atmospheric or near atmospheric pressure, such that a leak would actually cause coolant to spill. Purge valve 2238 may be used to purge the system of coolant when the system is turned off. Again, this prevents coolant from remaining in the electronic equipment plumbing under atmospheric or near atmospheric pressure, such that a leak would actually cause coolant to spill.

The components of the system 2200 encompassed by the box 2244 may be sufficiently small to be installed as a rack mount device in a traditional server tower. Further, those components may be placed on a tray such that any leaks that may occur in the rack-mounted unit would be captured by the tray and would not impact any of the server equipment.

Figures 23A, 23B:
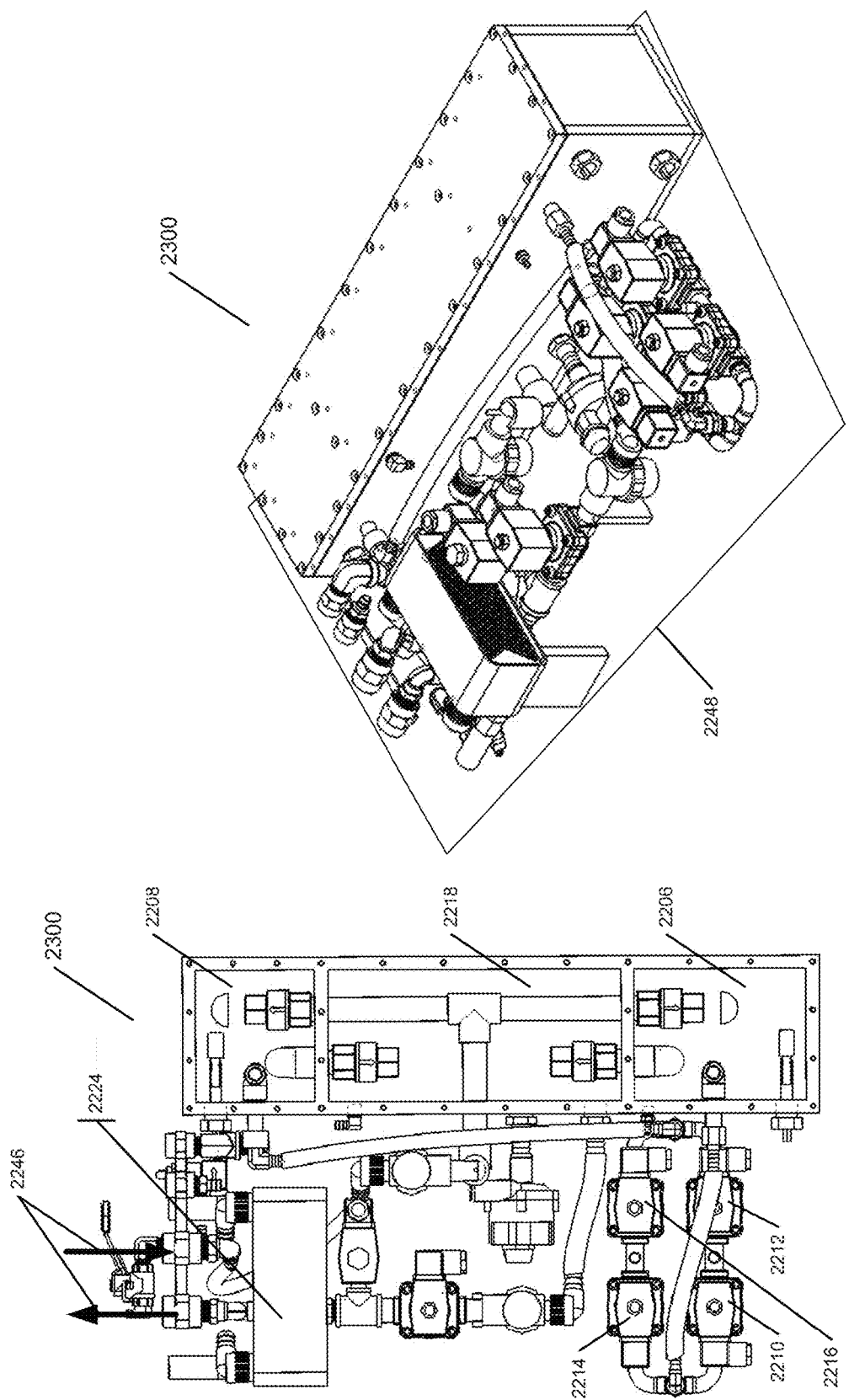
FIG. 23A is a top view of a of a single vacuum pump cooling system according to an example embodiment.
FIG. 23B is an isometric view of a of a single vacuum pump cooling system according to an example embodiment.

FIGS. 23A and 23B illustrate a top and isometric view of an actual rack-mountable system 2300 that would be encompassed by a box 2244. The principal components of the system include the main chamber 2206 and the auxiliary chamber 2208 that are in one-way fluid communication with the reservoir 2218. Valves 2210 and 2212 are connected to the vacuum line. Valves 2214 and 2216 are connected to the pressure line. The liquid-liquid heat exchanger 224 is connected to the reservoir 2218. Arrows 2246 illustrate the movement of the coolant into and out of the rack-mountable system 2300. A tray 2248 may be placed under the system 2300 to capture any liquid that might escape, thus preventing damage to any equipment that is in the same server rack as this rack-mountable system 2300. The rack-mountable system 2300 could cool up to 10 kW of servers in up to 10 racks. This would allow the costs of the system to be spread out the cost over a number of servers. It would be apparent that the teaching of this disclosure can be used to cool even larger server farms.

Figure 24:
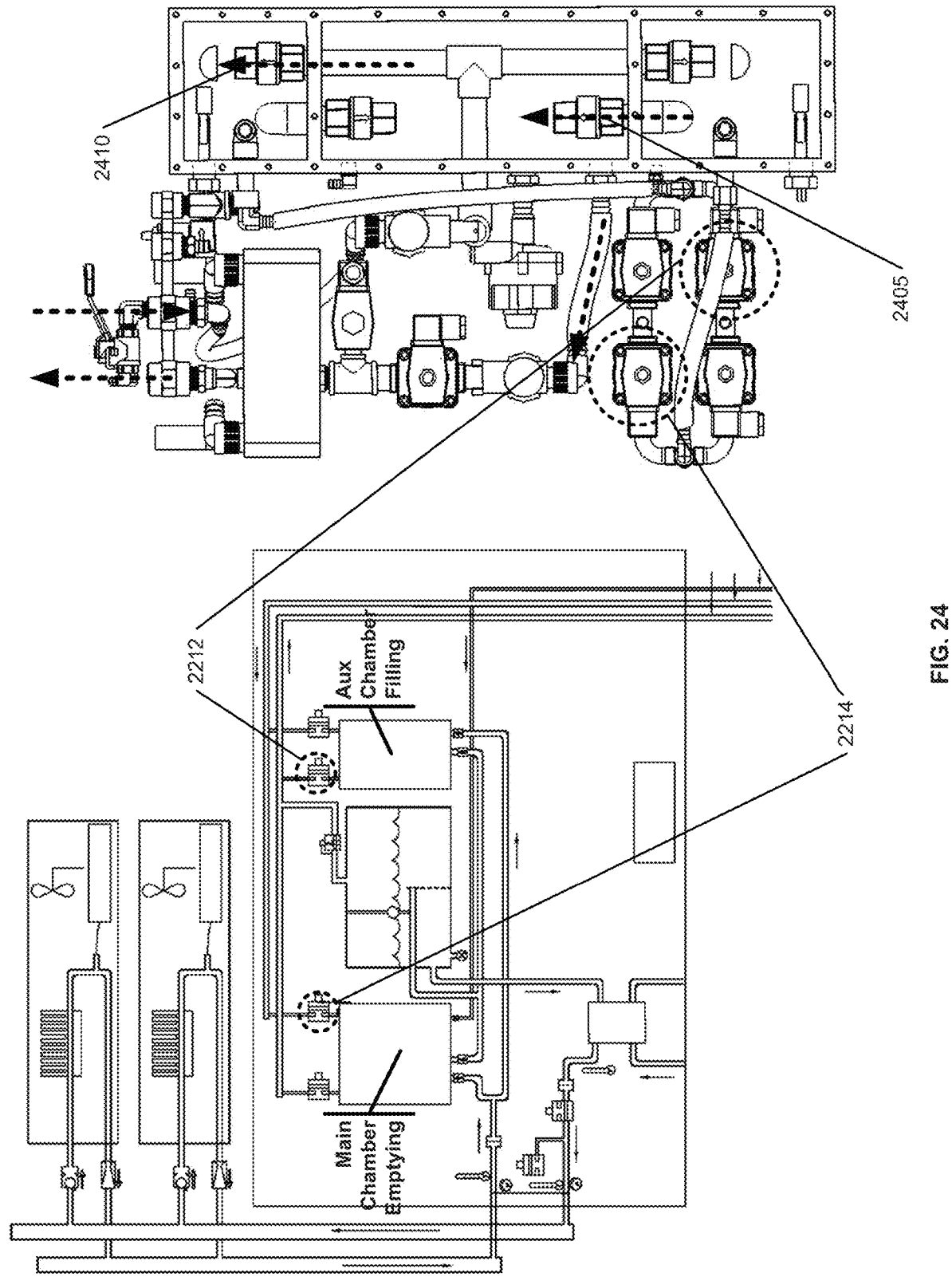
FIG. 24 is a schematic and top view of a single vacuum pump cooling system according to an example embodiment when the main chamber is emptying.
Figure 25:
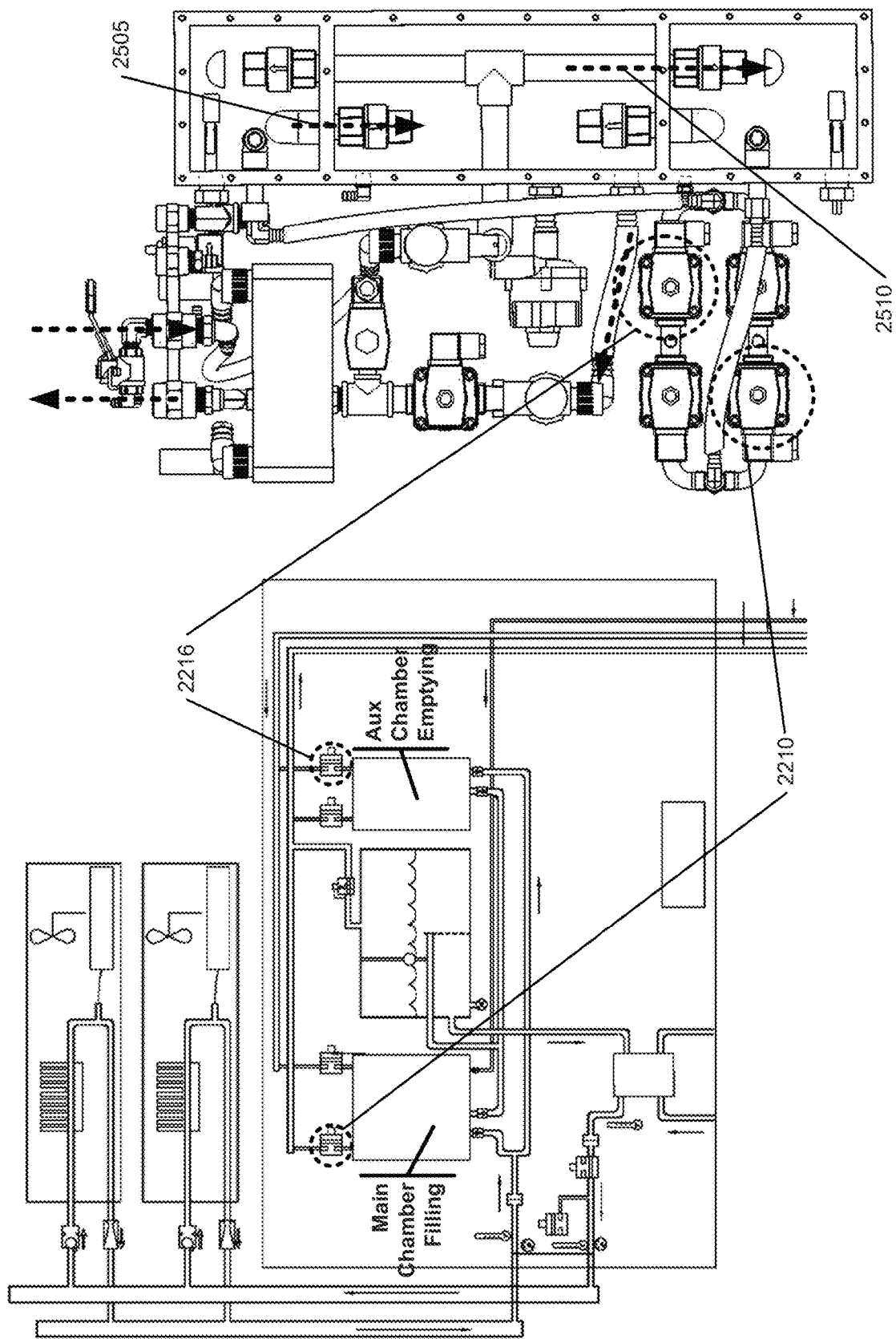
FIG. 25 is a schematic and top view of a single vacuum pump cooling system according to an example embodiment when the auxiliary chamber is emptying.

The operation of the system will now be described with reference to FIGS. 24 and 25. In FIG. 24, the main chamber 2206 is emptying into the reservoir 2218, as shown by arrow 2405 while the auxiliary chamber 2208 is filling with water returning from the computer equipment as shown by arrow 2410. This circulation is accomplished by opening valve 2114 (which is pressurized) and simultaneously opening valve 2212 (which is under vacuum). This creates a difference in pressure between the main chamber 2206 and the auxiliary chamber 2208 of about 10 to 15 in Hg, circulating the coolant though the system. Once the main chamber 2206 has emptied sufficiently, then it must be filled and the auxiliary emptied to continue the circulation. This operation is shown in FIG. 25. In FIG. 25, the auxiliary chamber 2208 is emptying into the reservoir 2218, as shown by arrow 2505 while the main chamber 2206 is filling with water returning from the computer equipment as shown by arrow 2510. This circulation is accomplished by opening the valve 2216 (which is pressurized) and simultaneously opening the valve 2210 (which is under vacuum). This creates a difference in pressure between the main chamber 2206 and the auxiliary chamber 2208 of about 10 to 15 in Hg, circulating the coolant though the system. The functions illustrated in FIGS. 24 and 25 are alternatively performed creating a circulation of the coolant using a single vacuum pump. To optimize the system, there may be slight overlap between these alternatives, but for the majority of time, when one chamber is filling the other is emptying. The control of the valves is accomplished by way of the controller 2232.

FIG. 26 illustrates the single vacuum pump 2602 used in system 2200. The pump compressor 2602 may actually include two or more vacuum pumps to provide redundancy to the system, which would reduce the chance of shutdown to a negligible level. For example having two vacuum pumps 2602 sized to run at 50% capacity, would allow one vacuum pump to take the entire load should the other fail. The vacuum pump is connected to the vacuum line 2202 and its exhaust is outputted to the pressurized line 2204. The vacuum pump creates the pressure differential that causes the coolant to circulate through the system 2200. Prior to the vacuum pump 2602 a coolant recovery device 2608 may be placed. Here the coolant recovery device 2608 is an air/water separator, but other coolant recovery devices include, and are not limited to, mufflers and thermoelectric devices that condense any moisture out of the air. In fact, a thermoelectric device may be used to condense moisture out of the atmosphere in order to make up for any coolant loss. As the vacuum line sucks air out of the main and auxiliary chambers, the air will be at or near 100% relative humidity and if that moisture in the air is not captured, then the system will require frequent coolant addition. This can then become an annoying maintenance issue. By routing the vacuum line 2202 through the coolant recovery device 2608, moisture can be removed from the humid air in the vacuum line 2202. That coolant drops to the bottom of the device 2608. The device 2608 is connected to main chamber 2206 via the condensation return line 2250, such that when the main chamber 2206 is under vacuum, there is a pressure differential of about 10 to 15 in Hg pushing the recovered coolant to the main chamber 2206. A check valve 2610 prevents the coolant from traveling in the wrong direction within the condensation return line 2250. Of course, a pump could also be used to pump the coolant back to the system. For example, a piston pump, gear pump or peristaltic pump would be suitable.

After the vacuum pump 2602, a second coolant recovery device 2604 may be placed. Here the second coolant recovery device 2604 is a muffler/condenser. Although not shown, the pressurized line 2204 may be vented to atmospheric pressure. When vented in this fashion, the system 2200 still operates, and the pressurized line 2204 would be at atmospheric pressure and would be pressurized as compared to the vacuum line 2202. As the vacuum pump 2602 evacuates the air, it will still have some humidity, and if that moisture in the air is not captured, then the system will require frequent coolant addition. The second coolant recovery device 2604 condenses the coolant out of the air, allowing the coolant to collect at the bottom of the device 2604. Here the coolant recovery device 2604 is a muffler, but other coolant recovery devices include, and are not limited to, air/water separators and thermoelectric devices that condense any moisture out of the air. In fact, a thermoelectric device may be used to condense moisture out of the atmosphere in order to make up for any coolant loss. The device 2606 is connected to the main chamber 2206 via the condensation return line 2250, such that when the main chamber 2206 is under vacuum, there is a pressure differential of about 25 to 30 in Hg. A float valve 2606 may be used, such that the valve 2606 is closed until a sufficient amount of coolant has collected at the bottom of the device 2604. Once the valve 2606 opens, the pressure differential pushes the recovered coolant to the main chamber 2206. Of course, a pump could also be used to pump the coolant back to the system. For example, a piston pump, gear pump or peristaltic pump would be suitable.

6.8 Flow Control in the Event of a Single Point Gross Leak

In the event that one of the servers has a damaged liquid cooling system and is leaking air into the system through a completely broken coolant conduit, the rest of the system should still operate, provided that the leakage rate into both sides of the liquid cooling system is controlled.

Figure 27A:
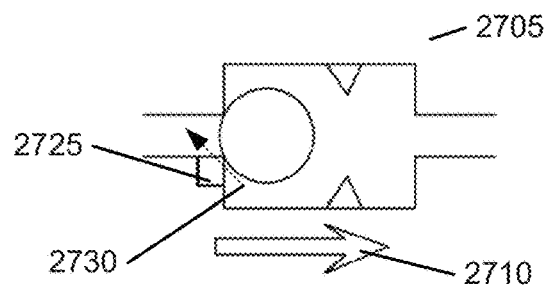
FIG. 27A is a schematic of a valve that may be used on the coolant supply side according to an example embodiment.
Figure 27B:
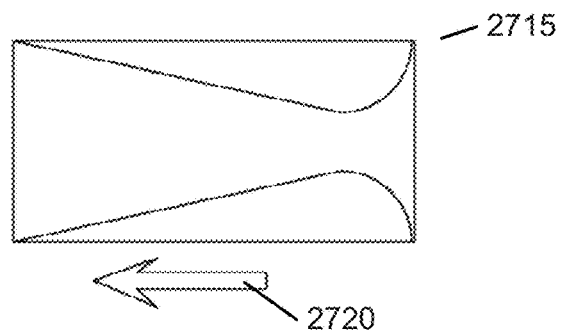
FIG. 27B is a schematic of a valve that may be used on the coolant return side according to an example embodiment.

Referring to FIGS. 27A and 27B, structures that can control the leakage rate are described. FIG. 27A illustrate a valve 2705 on the supply side (i.e., the valve 2705 is upstream of the electronic equipment as defined by the direction of coolant flow shown by arrow 2710), and FIG. 27B illustrates a valve 2715 on the return side (i.e., the valve 2715 is downstream of the electronic equipment, as defined by the direction of coolant flow shown by arrow 2720). In one embodiment these valves may be placed near the hot and cold manifold 2228, 2226) as shown in FIG. 22. On the supply side (valve 2705), the coolant may flow through a check valve, such as the one described by Tesla or a fluid diode, or a poppet and seat type of check valve with a built in leak. A groove in the seat can provide the necessary leak. The opening in the seat is shown at 2725, which allows a leak across the valve 2705 shown as arrow 2730. The reverse flow through the valve 2705 must be such that any coolant in the line upstream from the valve 2705 can be sucked back into the cold manifold 2226 and not leak out on the electronic equipment 2222. The leak, however, must not be so severe so as to adversely affect the other servers in the loop by introducing too much air into the system.

On the return side (valve 2715), the air flow must not be so excessive as to reduce the pump effectiveness substantially. One way to achieve this goal is to use a Venturi, which has a low pressure drop when flowing coolant at the nominal flow rate, and limits the flow of air into the system to that which can flow through the minimum diameter of the Venturi at the speed of sound. For example, a Venturi with a throat of 0.05 inches, will have a pressure drop of approximately 1 in Hg at 300 cc/min coolant flow rate, and it will flow approximately ½ standard cubic feet per minute of air at 20 in Hg vacuum. A large-scale system designed to cool 100 kW of servers may flow approximately 35 gal/min of coolant. A completely open sever line would therefore represent approximately 17% of the overall volume flow rate, and the system could still efficiency cool the electronic equipment.

6.9 Leak Detection

Leak detection can also be included in the systems previously described. Detecting leaks is important because it can lower the efficiency of the system. To detect a leak of air into the system, the flow rate of air and coolant back into the system should be measured. The flow rate of coolant may be measured by measuring the time it takes to fill one of the chambers (i.e., 2206, 2208) because the volume of those chambers is already known. Placing a level sensor in the chamber (see FIG. 22, part 2260) which sends a signal to the controller 2232 would allow the controller 2232 to calculate the coolant flow throughout the system. Alternatively, a flowmeter may be placed on the coolant line to measure the flow directly.

The flow rate of air may be measured by a flowmeter (see FIG. 22, part 2262) in the vacuum line 2202, that outputs a signal to the controller 2232. This flowmeter 2262 may be, but is not limited to, a hot wire, laminar flow element, orifice, or venturi. Under normal operation, when the main chamber 2206 is filling under suction, there will be a period when the air in the main chamber 2206 is being pumped down to the correct negative pressure level. After that period the negative pressure level will stabilize, and the flow rate of air should be equal to the flow rate of coolant. As is known in the art, air may dissolve in water or other coolants, and the maximum amount that can be dissolved as a function of temperature and pressure is well known. For example at 80F, up to 1.6% air may be present in water. Therefore, if an air leak exists, it may be detected by measuring the air flow rate out of a pump chamber (i.e., 2206, 2208), comparing it to the coolant flow rate into the pump chamber, and if the air flow rate is excessive this would indicate an air leak and an alarm would optionally be activated to alert the operator that a leak is present. This comparison and triggering of the alert may be performed by the controller 2232.

For example, if the vacuum pump has a displacement of 0.05 liters per revolution, and it spins at 1500 RPM, then it should flow 75 liters per minute. There are some losses and leaks within the vacuum pump, but they are repeatable and known for a given pump. Therefore given the RPM of the pump, and the pressure at the inlet, then the mass flow rate can be determined using the ideal gas law. The flow rate can also be measured at the vacuum pump outlet by means of a thermal mass flowmeter, or a venturi, orifice or other flow meter. The flow meter should be calibrated for humid air. The temperature and pressure of the water entering and leaving the cooling system is known, and this can be used to predict the amount of air that is dissolved in the water. It can also be used to predict the amount of water vapor in the gas above the water. The maximum amount of air that can be evolved from the water is the difference between the amount that could be dissolved at the temperature and pressure of the water leaving the cooling system, and the amount of air that could be in the water returning to the system. The controller could use a look up table to calculate the two amounts and the difference that would be expected at the system air outlet. If the amount of air in the water returning to the pump from the servers is excessive, then an alarm could be activated. A humidity sensor could be used to determine how much of the gas evolved is water vapor, or testing could be used to determine the range of outlet humidity. For example, in a typical system with a single vacuum pump, the maximum vacuum achieved with no air leaks, and a flow of 1 gal/min of water might be 24 in Hg. If there is a leak of 0.03 ft$^3$/min of air into the system, then the maximum vacuum will be only 20 in Hg, and this would indicate a leak or a vacuum pump failure.

The invention has been described in connection with specific embodiments that illustrate examples of the invention but do not limit its scope. Various example systems have been shown and described having various aspects and elements. Unless indicated otherwise, any feature, aspect or element of any of these systems may be removed from, added to, combined with or modified by any other feature, aspect or element of any of the systems. As will be apparent to persons skilled in the art, modifications and adaptations to the above-described systems and methods can be made without departing from the spirit and scope of the invention, which is defined only by the following claims. Moreover, the applicant expressly does not intend that the following claims "and the embodiments in the specification to be strictly coextensive." *Phillips* v. *AHW Corp.*, 415 F.3d 1303, 1323 (Fed. Cir. 2005) (en banc).

The invention claimed is:

1. A system for cooling an electrical device, the system comprising:
    a coolant circuit comprising:
        a coolant-containing heat exchanger thermally coupled to the electrical device;
        a coolant-containing reservoir in fluid communication with the coolant-containing heat exchanger, the reservoir comprising:
            an outlet port that allows coolant to travel from the reservoir to the coolant-containing heat exchanger; and
            an inlet port that allows coolant to travel from the coolant-containing heat exchanger to the reservoir;
        a venturi constriction in fluid communication with and positioned in between the coolant-containing heat exchanger and the inlet port, the venturi constriction configured to cause a pressure drop in the coolant traveling there through;
    a pump in fluid communication with the reservoir, the pump constructed to propel coolant from the reservoir to the coolant-containing heat exchanger and back to the reservoir; and
    a vacuum pump in fluid communication with the reservoir, the vacuum pump configured to maintain the coolant circuit under negative pressure relative to ambient pressure.

2. The system of claim 1, further comprising a vacuum line connecting the vacuum pump and the reservoir, and comprising a controller connected to:
    a first flowmeter measuring the air flowrate in the vacuum line;
    a second flowmeter measuring the coolant flowrate in the coolant circuit; and
    an alert structure;
    wherein the controller adapted to compare the measurement from the first flowmeter to the measurement from the second flowmeter and output a signal to the alert structure based on the comparison.

3. The system of claim 1, further comprising a check valve having a structure that allows a leak across the valve when the valve is in the closed position, the check valve located between the outlet port and the coolant-containing heat exchanger.

4. The system of claim 1, the coolant circuit further comprising a plurality of coolant-containing heat exchangers in fluid communication with the reservoir, wherein the plurality of coolant-containing heat exchangers are thermally coupled to a plurality of electrical devices.

5. The system of claim 3, wherein the pump provides a flow rate, and the check valve and venturi constriction are constructed such that when the connection between the reservoir and the coolant-containing heat exchanger is open to ambient pressure, the air that is allowed into the coolant circuit would represent less than 25% of the flow rate by volume.

6. The system of claim 1, wherein the coolant-containing heat exchanger draws heat from the electrical device into the coolant, the coolant circuit further comprising a second coolant-containing heat exchanger that draws heat away from the coolant.

7. The system of claim 6, wherein the second coolant-containing heat exchanger is an evaporative cooling tower or a facility water heat exchanger.

8. The system of claim 1, wherein the coolant-containing heat exchanger further comprises a turbulator adapted to cause the coolant to flow in a helical path.

9. The system of claim 1, further comprising a fluid level sensor located in the reservoir and providing an output based on the level of the coolant in the reservoir, the pump being adapted to operate in response to the output of the fluid level sensor.

10. The system of claim 1, further comprising a vacuum regulator in vacuum communication with the vacuum pump and adapted to maintain a pressure in the reservoir less than atmospheric pressure.

11. The system of claim 1, further comprising a fluid filter in fluid communication with the coolant-containing heat exchanger and adapted to prevent debris from entering the coolant-containing heat exchanger.

12. The system of claim 1, further comprising a connector releasably connecting the coolant-containing heat exchanger to the coolant-containing reservoir, the connector adapted to release the coolant-containing heat exchanger from the coolant-containing reservoir only when substantially all of the coolant has been evacuated out of the coolant-containing heat exchanger.

13. A system for cooling an electrical device, the system comprising:
    a coolant circuit comprising:
        a coolant-containing heat exchanger thermally coupled to the electrical device;
        a coolant-containing reservoir in fluid communication with the coolant-containing heat exchanger, the reservoir comprising:
            an outlet port that allows coolant to travel from the reservoir to the coolant-containing heat exchanger; and
            an inlet port that allows coolant to travel from the coolant-containing heat exchanger to the reservoir;
        a venturi constriction in fluid communication with the coolant-containing heat exchanger and the reservoir, the venturi constriction located between the coolant-containing heat exchanger and the inlet port;
    a vacuum pump in fluid communication with the reservoir, wherein the vacuum is configured to (1) maintain the coolant circuit under negative pressure relative to ambient pressure, and (2) propel coolant from the reservoir to the coolant-containing heat exchanger and back to the reservoir vacuum.

14. The system of claim 13, further comprising a vacuum line connecting the vacuum pump and the reservoir and comprising a controller connected to:
    a first flowmeter measuring the air flowrate in the vacuum line;
    a second flowmeter measuring the coolant flowrate in the coolant circuit; and
    an alert structure;
    wherein the controller adapted to compare the measurement from the first flowmeter to the measurement from the second flowmeter and output a signal to the alert structure based on the comparison.

15. The system of claim 13, further comprising a check valve in fluid communication with the coolant-containing heat exchanger and the reservoir, the check valve having a structure that allows a leak across the valve when the valve is in the closed position, wherein the check valve located between the outlet port and the coolant-containing heat exchanger.

16. The system of claim 13, the coolant circuit further comprising a plurality of coolant-containing heat exchangers in fluid communication with the reservoir, wherein the plurality of coolant-containing heat exchangers are thermally coupled to a plurality of electrical devices.

17. The system of claim 15, wherein the vacuum comprises a flow rate, and the check valve and venturi constriction are constructed such that when the connection between the reservoir and the heat exchanger is open to ambient pressure, the air that is allowed into the coolant circuit would represent less than 25% of the flow rate by volume.

18. The system of claim 13, wherein the heat exchanger draws heat from the electrical device into the coolant, the coolant circuit further comprising a second coolant-containing heat exchanger that draws heat away from the coolant.

19. The system of claim 18, wherein the second coolant-containing heat exchanger comprises an evaporative cooling tower or a facility water heat exchanger.

20. The system of claim 13, further comprising a fluid filter in fluid communication with the coolant-containing heat exchanger and adapted to prevent debris from entering the coolant-containing heat exchanger.

21. The system of claim 13, further comprising a fluid level sensor located in the reservoir and providing an output based on the level of the coolant in the reservoir, the pump being adapted to operate in response to the output of the fluid level sensor.

* * * * *